US012696450B2

(12) United States Patent
Choi et al.

(10) Patent No.: US 12,696,450 B2
(45) Date of Patent: Jul. 28, 2026

(54) SEMICONDUCTOR DEVICE AND METHOD OF MANUFACTURING SEMICONDUCTOR DEVICE

(71) Applicant: SK hynix Inc., Gyeonggi-do (KR)

(72) Inventors: Seok Min Choi, Gyeonggi-do (KR); Jeong Hwan Kim, Gyeonggi-do (KR); Jung Shik Jang, Gyeonggi-do (KR); Rho Gyu Kwak, Gyeonggi-do (KR); In Su Park, Gyeonggi-do (KR); Na Yeong Yang, Gyeonggi-do (KR); Won Geun Choi, Gyeonggi-do (KR); Jung Dal Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 412 days.

(21) Appl. No.: 18/392,243

(22) Filed: Dec. 21, 2023

(65) Prior Publication Data

US 2025/0107078 A1     Mar. 27, 2025

(30) Foreign Application Priority Data

Sep. 26, 2023     (KR) ........................ 10-2023-0128779

(51) Int. Cl.
| | |
|---|---|
| *H01L 23/00* | (2006.01) |
| *H01L 25/18* | (2023.01) |
| *H10B 41/27* | (2023.01) |
| *H10B 43/27* | (2023.01) |
| *H10B 80/00* | (2026.01) |
| *H10W 90/00* | (2026.01) |

(52) U.S. Cl.
CPC ............. *H10B 43/27* (2023.02); *H10B 41/27* (2023.02); *H10B 80/00* (2023.02); *H10W 90/00* (2026.01); *H10W 90/792* (2026.01)

(58) Field of Classification Search
CPC ........ H10B 41/27; H10B 43/27; H10B 43/40; H10B 80/00; H10W 90/00; H10W 90/792
See application file for complete search history.

(56) References Cited

U.S. PATENT DOCUMENTS

| | | | | |
|---|---|---|---|---|
| 10,608,009 | B2 * | 3/2020 | Ikeda ..................... | H10B 43/40 |
| 2024/0130122 | A1 * | 4/2024 | Lee ........................ | H10B 43/27 |
| 2024/0215239 | A1 * | 6/2024 | Wu ........................ | H10B 43/27 |
| 2024/0381644 | A1 * | 11/2024 | Mizutsu ................ | H10B 43/27 |
| 2024/0407164 | A1 * | 12/2024 | Norizuki ............... | H10B 43/27 |

FOREIGN PATENT DOCUMENTS

KR     102125018 B1     7/2020

* cited by examiner

*Primary Examiner* — David C Spalla
(74) *Attorney, Agent, or Firm* — IP & T GROUP LLP

(57) ABSTRACT

A semiconductor device may include a gate structure including stacked local lines and a multi-step structure, wherein the multi-step structure defines pads of the local lines, channel patterns respectively disposed over the pads, a block word line disposed over the channel patterns and extending along a profile of the multi-step structure, and first contact plugs passing through the channel patterns and respectively connecting the channel patterns and the local lines.

18 Claims, 54 Drawing Sheets

| SP_B |
| :---: |
| CA |
| BS |
| PC |
| SUB |

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2023-0128779 filed on Sep. 26, 2023, which is incorporated herein by reference in its entirety.

BACKGROUND

1. Technical Field

The present invention disclosure relates generally to an electronic device, and more particularly, to a semiconductor device and a method of manufacturing the semiconductor device.

2. Related Art

An integration degree of a semiconductor device is mainly determined by an area occupied by a unit memory cell. Recently, as improvement in an integration degree of a semiconductor device in which a memory cell is formed as a single layer on a substrate reaches a limit, a three-dimensional semiconductor device in which memory cells are stacked on a substrate is being proposed. In addition, various structures and manufacturing methods are being developed in order to improve operation reliability of the semiconductor device.

SUMMARY

According to an embodiment of the present invention disclosure, a semiconductor device may include a gate structure including stacked local lines and a multi-step structure, wherein the multi-step structure defines pads of the local lines, channel patterns respectively disposed over the pads, a block word line disposed over the channel patterns and extending along a profile of the multi-step structure, and first contact plugs passing through the channel patterns and respectively connecting the channel patterns and the local lines.

According to an embodiment of the present invention disclosure, a semiconductor device may include a gate structure including stacked local lines, first contact plugs extending through the gate structure and respectively connected to the local lines, channel patterns disposed over the gate structure and respectively connected to the first contact plugs, and a block word lines disposed over the channel patterns.

According to an embodiment of the present invention disclosure, a method of manufacturing a semiconductor device may include forming a stack including first material layers and second material layers alternately stacked, forming a multi-step structure exposing each of the first material layers, in the stack, forming channel patterns on the multi-step structure, forming a block word line extending along a profile of the multi-step structure, and forming first contact plugs passing through the channel patterns and extending into the stack.

According to an embodiment of the present invention disclosure, a method of manufacturing a semiconductor device may include forming a gate structure including local lines and insulating layers alternately stacked, forming first contact plugs extending through the gate structure and respectively connected to the local lines, forming channel patterns respectively connected to the first contact plugs on the gate structure, and forming a block word line crossing the channel patterns and extending on the gate structure.

These and other features and advantages of the present invention disclosure will become better understood from the following detailed description and drawings.

BRIEF DESCRIPTION OF THE DRAWINGS

FIGS. 5A and 5B are diagrams illustrating a structure of a semiconductor device according to an embodiment of the present invention disclosure.

FIG. 21 is a configuration diagram of a semiconductor device according to an embodiment of the present invention disclosure.

DETAILED DESCRIPTION

An embodiment of the present invention disclosure provides a semiconductor device and a method of manufacturing the semiconductor device having a stable structure and improved characteristic.

An integration degree of a semiconductor device may be improved by stacking memory cells in a three dimension. In addition, a semiconductor device with a stable structure and improved reliability may be provided.

Hereinafter, embodiments according to the technical concepts of the present invention disclosure are described with reference to the accompanying drawings.

3

Figure 1:
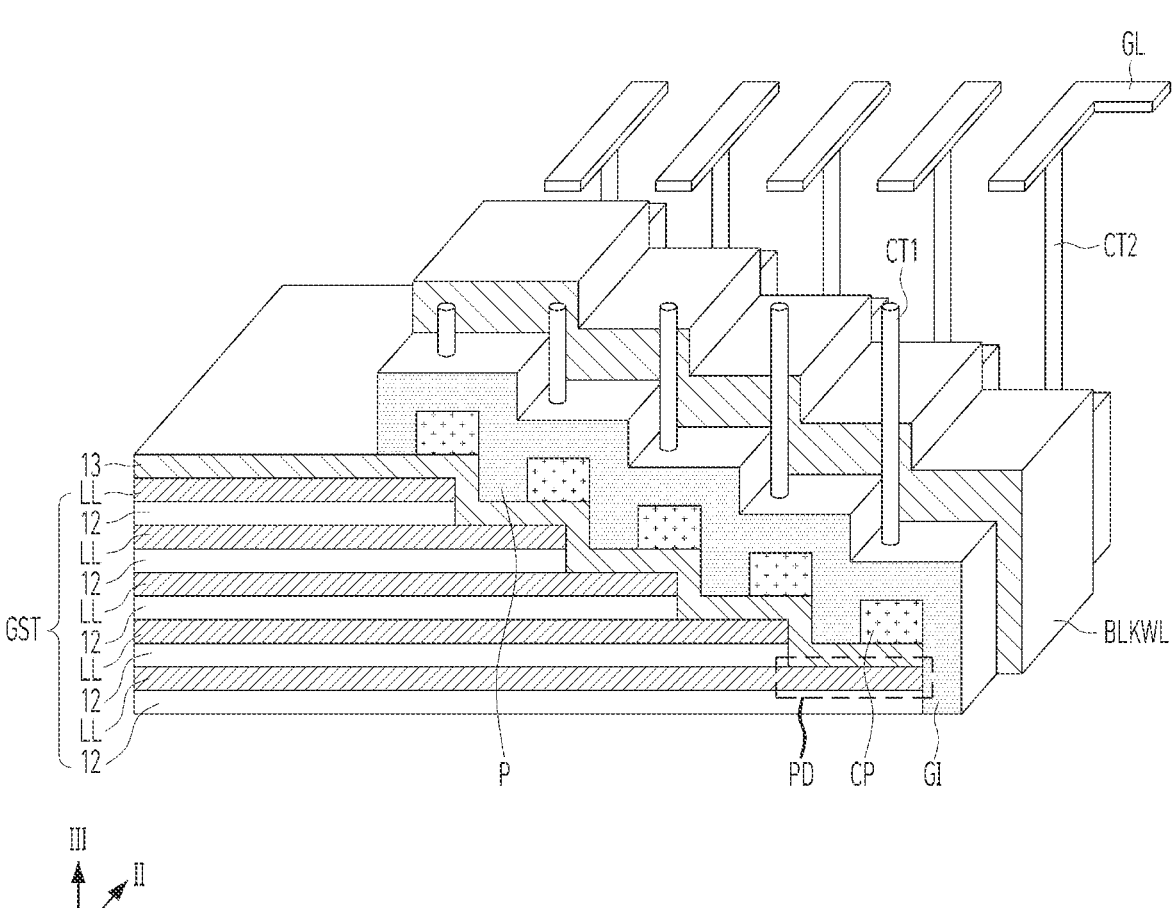
FIG. 1 is a diagram illustrating a structure of a semiconductor device according to an embodiment of the present invention disclosure.

FIG. 1 is a diagram illustrating a structure of a semiconductor device according to an embodiment of the present invention disclosure.

Referring to FIG. 1, the semiconductor device may include a gate structure GST, channel patterns CP, a block word line BLKWL, and first contact plugs CT1. The semiconductor device may further include at least one of a global line GL, second contact plugs CT2, a buffer layer 13, and a gate insulating layer GI.

The gate structure GST may include local lines LL and insulating layers 12 alternately stacked. The local lines LL may include a local source select line, a local drain select line, or a local word line. The local lines LL may be made of or include a conductive material such as for example, polysilicon, tungsten, or molybdenum. Polysilicon as this term is used in this disclosure refers to polycrystalline silicon (poly-Si). The gate structure GST may include a multi-step structure. The multi-step structure may extend in a first direction I. Each local line LL may be exposed through the multi-step structure, and the exposed portion of each local line may be defined as a pad PD.

The buffer layer 13 may be disposed over the gate structure GST. The buffer layer 13 may be formed along a profile of the multi-step structure and may cover the pads PD. The buffer layer 13 may be made of or include an insulating material such as oxide.

The channel patterns CP may be disposed over the gate structure GST and, more specifically, may be disposed over the buffer layer 13. Hence, the channel patterns CP may be in direct contact with the buffer layer 13. The channel pattern CP may be made of or include a semiconductor material, such as, at least one single crystal silicon, polysilicon, germanium Ge, silicon germanium SiGe, and gallium arsenide GaAs. The channel pattern CP may include junctions disposed over both sides of the block word line BLKWL. The junctions may include a source region and a drain region. The channel patterns CP may be respectively disposed over the pads PD. The channel patterns CP may be arranged to be spaced apart in the first direction I and may extend in a second direction II. The second direction II may be a direction crossing the first direction I. In an embodiment, the first and second directions I and II may be orthogonal to each other.

The block word line BLKWL may be disposed over the channel patterns CP and may extend in the first direction I along the profile of the multi-step structure. The block word line BLKWL may be made of or include a conductive material such as, for example, polysilicon, tungsten, or molybdenum.

The gate insulating layer GI may be disposed between the channel patterns CP and the block word line BLKWL. The gate insulating layer GI may surround the channel patterns CP and may extend in the first direction I along the profile of the multi-step structure. The gate insulating layer GI may include protrusions P protruding between the multi-step structure and the channel patterns CP. A top surface of the gate insulating layer GI may have a multi-step profile.

The first contact plugs CT1 may each pass through the channel pattern CP and may be connected to a corresponding local line LL. The first contact plugs CT1 may each pass through the gate insulating layer GI, the channel pattern CP, and the buffer layer 13, and may be electrically connected to its corresponding local line LL. Accordingly, each of the first contact plugs CT1 may extend to a different depth into the gate structure GST and may be respectively connected to a different local line LL. Therefore, the channel patterns CP and the local lines LL may be connected through the first contact plugs CT1.

The second contact plugs CT2 may be connected to the channel pattern CP on an opposite side of the first contact plugs CT1. A pair of first contact plugs CT1 and second contact plugs CT2 may be disposed to face each other with the block word line BLKWL interposed between, and may be connected to the same channel pattern CP. The second contact plugs CT2 may respectively connect the channel patterns CP and the global lines GL.

According to the structure described above, pass transistors may be disposed at the regions where the channel patterns CP and the block word line BLKWL cross. Each pass transistor may be a switch that controls the connection between a global line GL and a corresponding local line LL. The pass transistors may be turned on or turned off according to a block select signal applied to the block word line BLKWL. When a pass transistor is turned on, a corresponding pair of a global line GL and a local line LL may be connected through the corresponding first and second contact plugs CT1 and CT2.

The pass transistors may be disposed over the multi-step structure. Because the pass transistors are disposed over the multi-step structure, a separate area for forming the pass transistors on or under the gate structure GST may not be required and, therefore, the memory integration degree (also known as integration density, of component density) of the semiconductor device may be increased significantly.

Figure 2A:
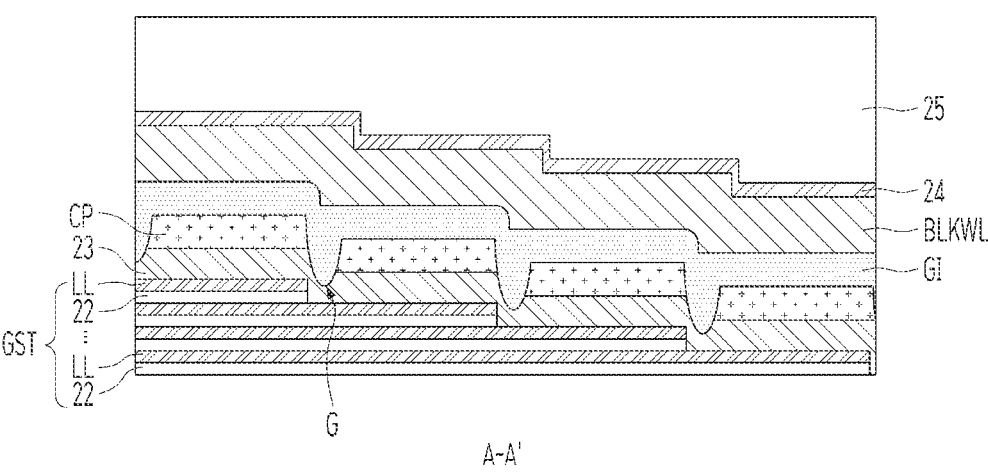
FIGS. 2A to 2D are diagrams illustrating a structure of a semiconductor device according to an embodiment of the present invention disclosure.
Figure 2B:
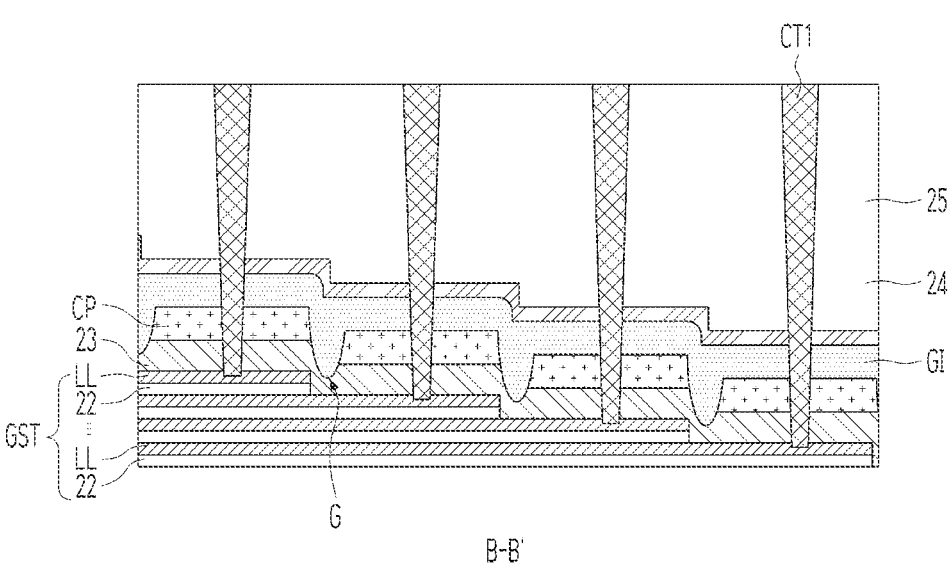
Figure 2C:
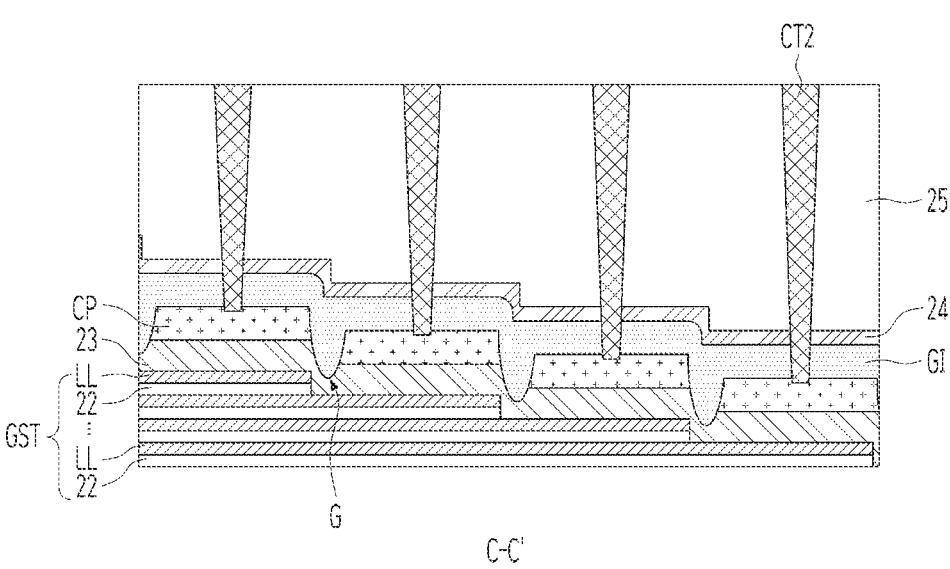
Figure 2D:
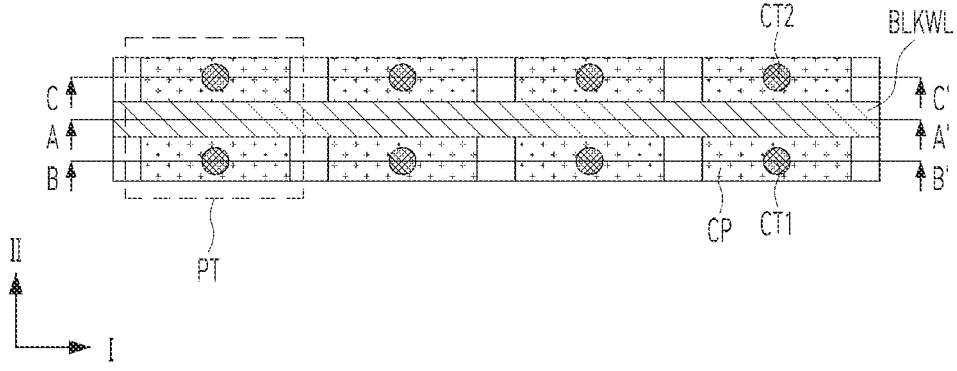

FIGS. 2A to 2D are diagrams illustrating a structure of a semiconductor device according to an embodiment of the present invention disclosure. FIG. 2D is a plan view, FIG. 2A is a cross-sectional view taken along a line A-A' of FIG. 2D, FIG. 2B is a cross-sectional view taken along a line B-B' of FIG. 2D, and FIG. 2C is a cross-sectional view taken along a line C-C' of FIG. 2D. Hereinafter, a description of a content overlapping the content already described may be omitted.

Referring to FIGS. 2A to 2D, the semiconductor device may include at least one a gate structure GST, a channel pattern CP, a buffer layer 23, a gate insulating layer GI, a block word line BLKWL, an etch stop layer 24, an interlayer insulating layer 25, first contact plugs CT1, and second contact plugs CT2.

The gate structure GST may include local lines LL and insulating layers 22 alternately stacked. The buffer layer 23 may be disposed over the gate structure GST. The channel patterns CP may be disposed over the gate structure GST and, more particularly, the channel patterns CP may be disposed over the buffer layer 23. The block word line BLKWL may be disposed over the channel patterns CP, may cross the channel patterns CP, and may extend in the first direction I. The gate insulating layer GI may be disposed between the channel patterns CP and the block word line BLKWL. The etch stop layer 24 may be disposed over the block word line BLKWL and the gate insulating layer GI.

The buffer layer 23 may include a plurality of grooves G on a top surface thereof. The grooves G may be respectively disposed between the channel patterns CP. A sidewall of the channel patterns CP may include a curved surface, and the curved surface may be connected to the groove G. The gate insulating layer GI may be filled in the groove G.

A top surface of the gate insulating layer GI may have a multi-step profile. The multi-step profile of the gate insulating layer GI may be transferred from a multi-step structure of the gate structure GST. The block word line BLKWL may have a multi-step profile on at least one a top surface and a lower surface. The multi-step profile of the block word line BLKWL may be transferred from the gate insulating layer GI.

The first contact plugs CT1 may pass through the channel pattern CP and may be connected to corresponding local lines LL. The first contact plugs CT1 may pass through the interlayer insulating layer 25, the etch stop layer 24, the gate insulating layer GI, the channel pattern CP, and the buffer layer 23, and may be electrically connected to corresponding local lines LL. In an embodiment, the first contact plugs CT1 may be directly connected to the channel pattern CP and the corresponding local lines LL.

The second contact plugs CT2 may be connected to the channel pattern CP. The second contact plugs CT2 may pass through the interlayer insulating layer 25, the etch stop layer 24, and the gate insulating layer GI, and may be connected to the channel pattern CP. In an embodiment, the second contact plugs CT2 may be connected to a top surface of the channel pattern CP.

According to the structure described above, pass transistors PT may be formed in the multi-step structure of the gate structure GST. The pass transistors PT may be disposed at each step, and the pass transistors PT may be arranged to be spaced apart along the first direction I. Accordingly, the pass transistors PT may be disposed at different levels.

In each pass transistor PT, the second contact plug CT2 may be connected to the source region of the channel pattern CP, and the first contact plug CT1 may be connected to the drain region of the channel pattern CP. Therefore, when the pass transistor is turned on, a bias of the global line may be transferred to the local line LL.

Figure 3A:
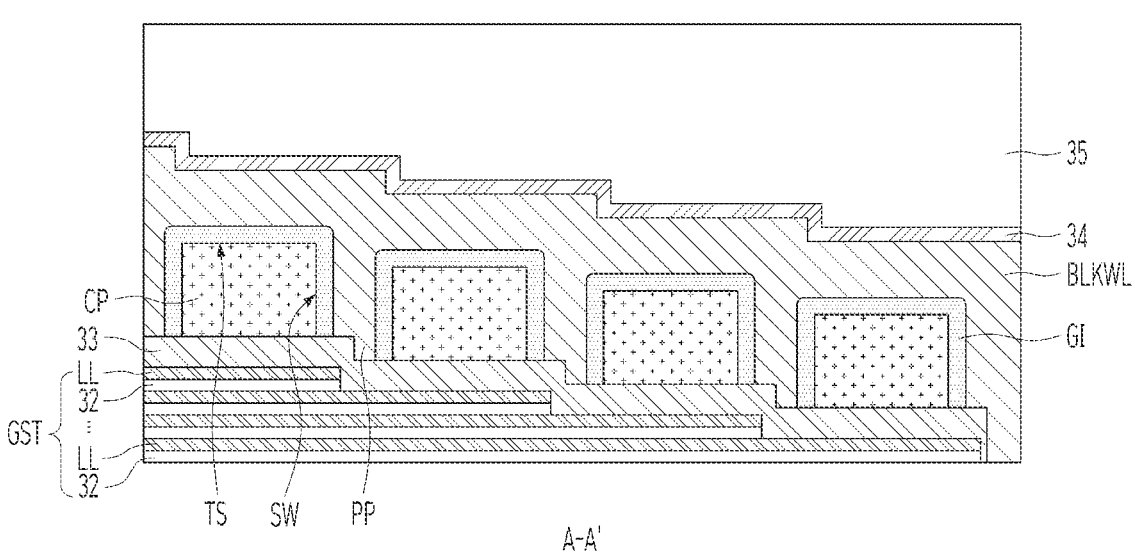
FIGS. 3A to 3D are diagrams illustrating a structure of a semiconductor device according to an embodiment of the present invention disclosure.
Figure 3B:
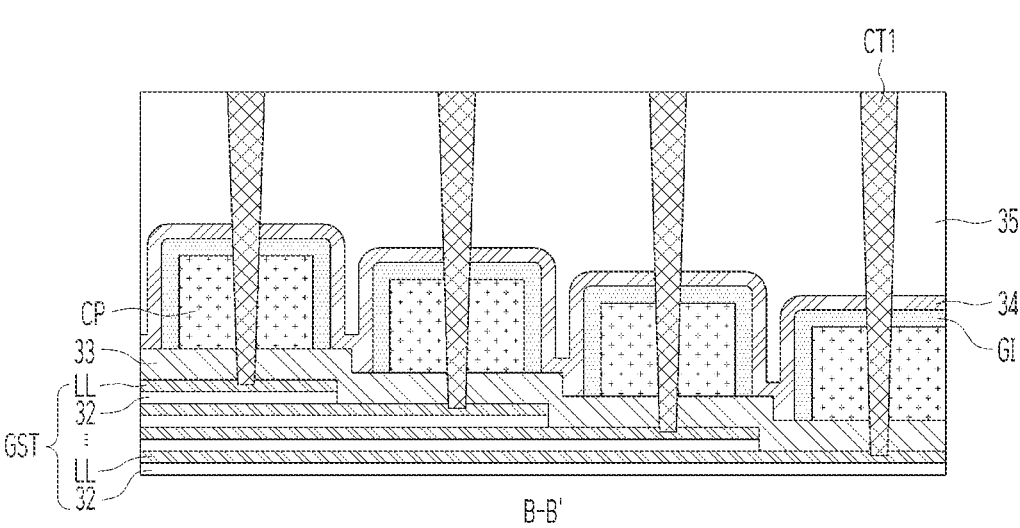
Figure 3C:
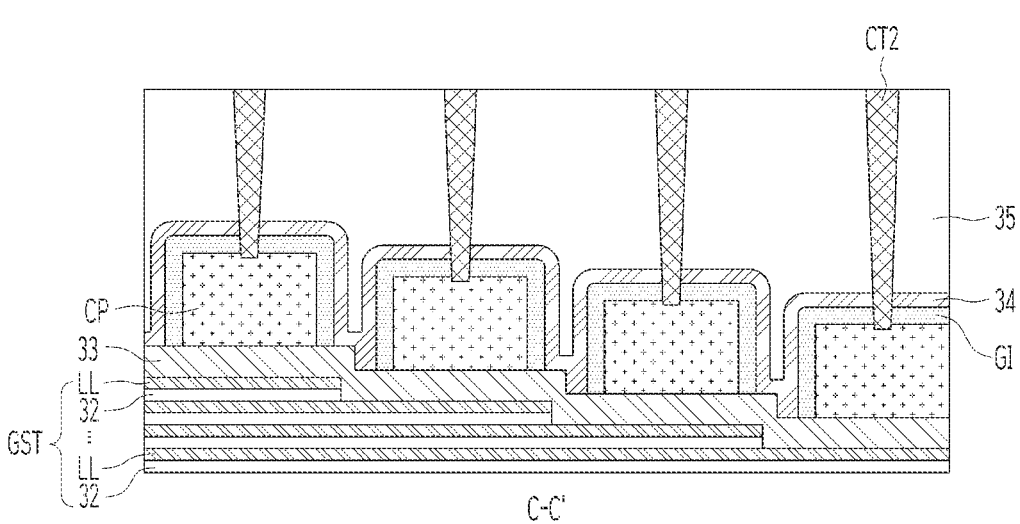
Figure 3D:
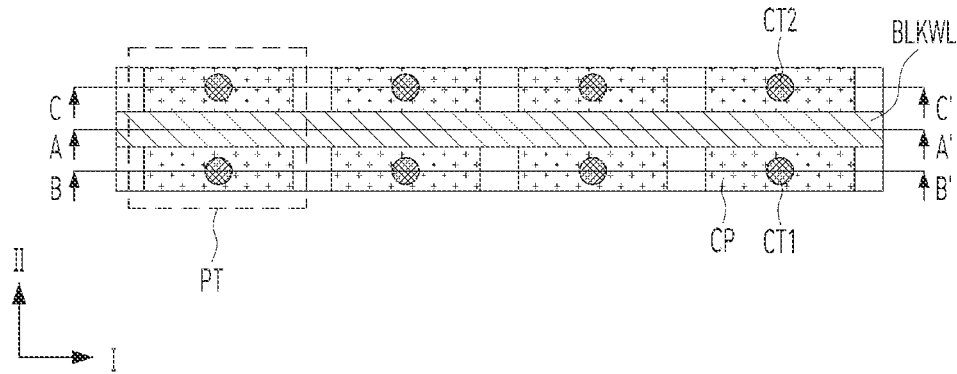

FIGS. 3A to 3D are diagrams illustrating a structure of a semiconductor device according to an embodiment of the present invention disclosure. FIG. 3D is a plan view, FIG. 3A is a cross-sectional view taken along a line A-A' of FIG. 3D, FIG. 3B is a cross-sectional view taken along a line B-B' of FIG. 3D, and FIG. 3C is a cross-sectional view taken along a line C-C' of FIG. 2D. Hereinafter, description of any content overlapping already described content may be omitted.

Referring to FIGS. 3A to 3D, the semiconductor device may include at least one a gate structure GST, a channel pattern CP, a buffer layer 33, a gate insulating layer GI, a block word line BLKWL, an etch stop layer 34, an interlayer insulating layer 35, a first contact plug CT1, and a second contact plug CT2.

The gate structure GST may include local lines LL and insulating layers 32 alternately stacked. The channel patterns CP may be disposed over the gate structure GST. The block word line BLKWL may be disposed over the channel patterns CP, may cross the channel patterns CP, and may extend in the first direction I. The etch stop layer 34 may be disposed over the block word line BLKWL, the gate insulating layer GI, and the buffer layer 33.

The buffer layer 33 may be disposed over the gate structure GST. The buffer layer 33 may be disposed between the gate structure GST and the channel patterns CP. The buffer layer 33 may extend in the first direction I along a profile of a multi-step structure. Because the channel patterns CP are spaced apart from each other, the buffer layer 33 may also be in contact with the block word line BLKWL which fills the spaces between consecutive channel patterns CP. The buffer layer 33 may also have a multi-step structure profile with each step of the buffer layer 33 being disposed under a corresponding channel pattern CP. Each step of the buffer layer 33 may only partially overlap with the corresponding channel pattern CP and may have edge regions not covered by the channel pattern CP.

The gate insulating layers GI may each respectively surround a corresponding one of the channel patterns CP. More specifically, the gate insulating layer GI may be formed along a sidewall and a top surface of the corresponding channel pattern CP. A space between channel patterns CP adjacent in the first direction I may not be filled with the gate insulating layers GI. In this case, the buffer layer 33 may be exposed between the gate insulating layers GI.

The block word line BLKWL may extend in the first direction I while surrounding the channel patterns CP. The block word line BLKWL may surround a top surface TS and sidewalls SW of the channel pattern CP. The block word line BLKWL may extend in the first direction I while surrounding at least three surfaces of the channel patterns CP with the gate insulating layers GI disposed therebetween. The block word line BLKWL may include protrusions PP protruding between the channel patterns CP and contacting the buffer layer 33.

Each of the first contact plugs CT1 may pass through the etch stop layer 34, the gate insulating layer GI and the corresponding channel patterns CP to connect to the corresponding local line LL. The second contact plugs CT2 may pass through the etch stop layer 34, and the gate insulating layer GI to connect to the corresponding channel patterns CP. Accordingly a bottom end of each of the second contact plugs may be in contact with the corresponding channel pattern CP.

According to the structure described above, pass transistors PT may be disposed over the multi-step structure of the gate structure GST. The block word line BLKWL may protrude between the channel patterns CP, and thus the area where the block word line BLKWL and the channel pattern CP overlap may be increased. Therefore, an operation characteristic of the pass transistor PT may be improved.

Figure 4A:
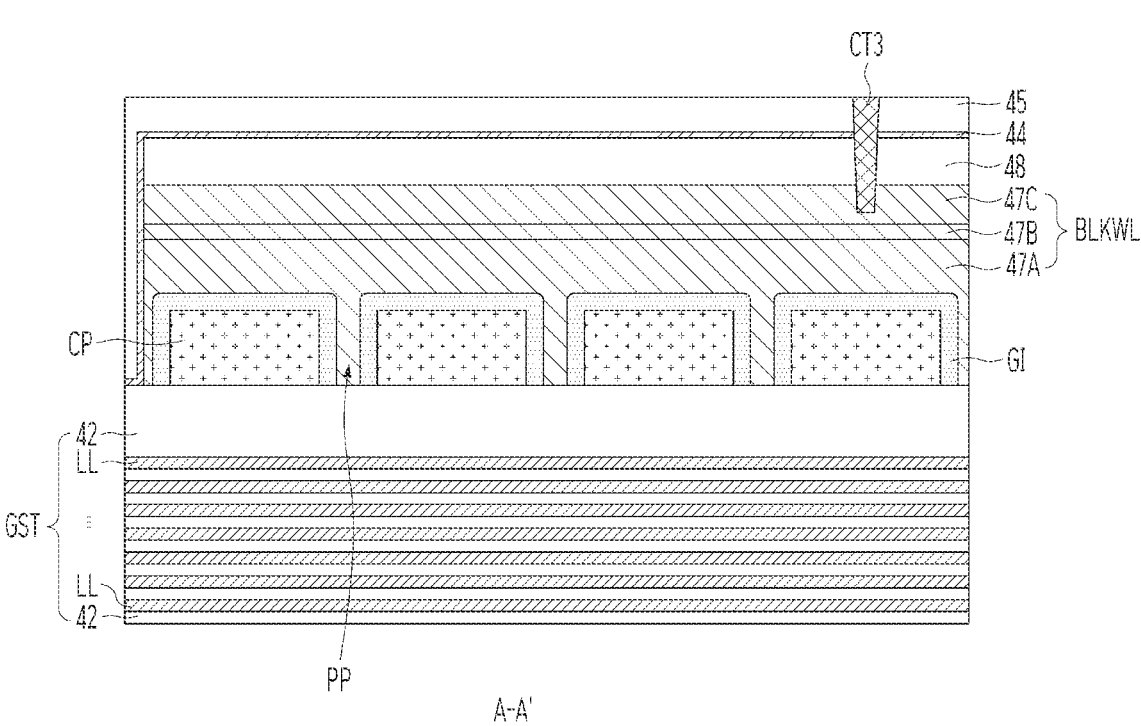
FIGS. 4A to 4D are diagrams illustrating a structure of a semiconductor device according to an embodiment of the present invention disclosure.
Figure 4B:
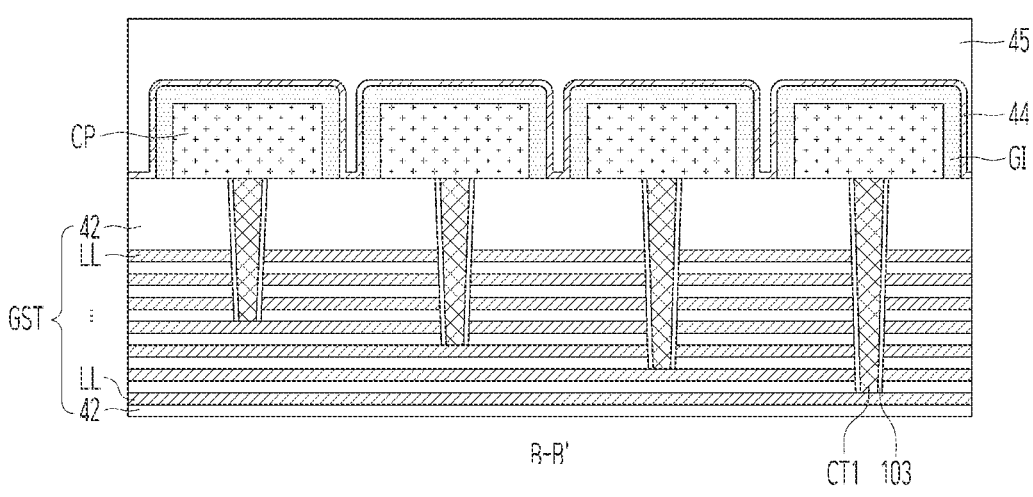
Figure 4C:
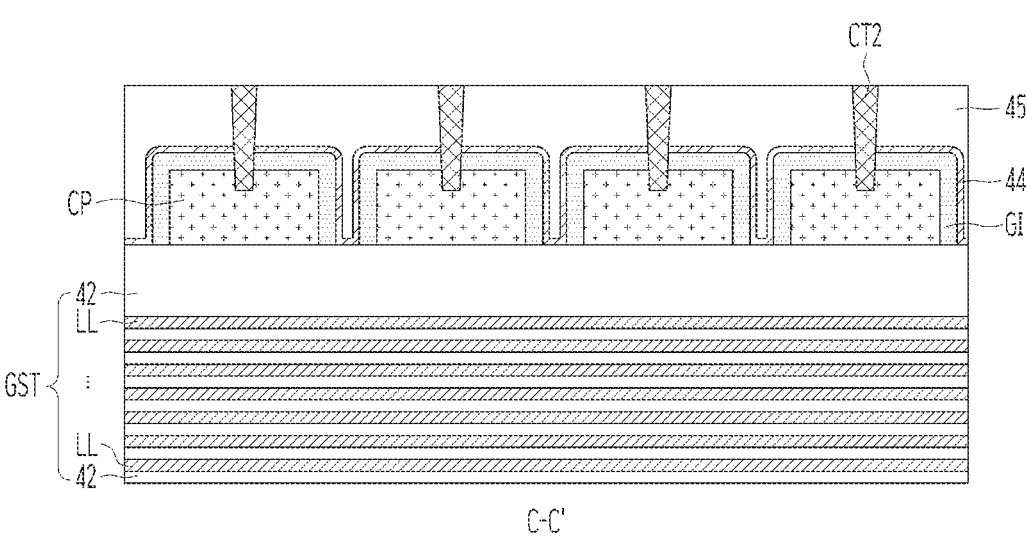
Figure 4D:
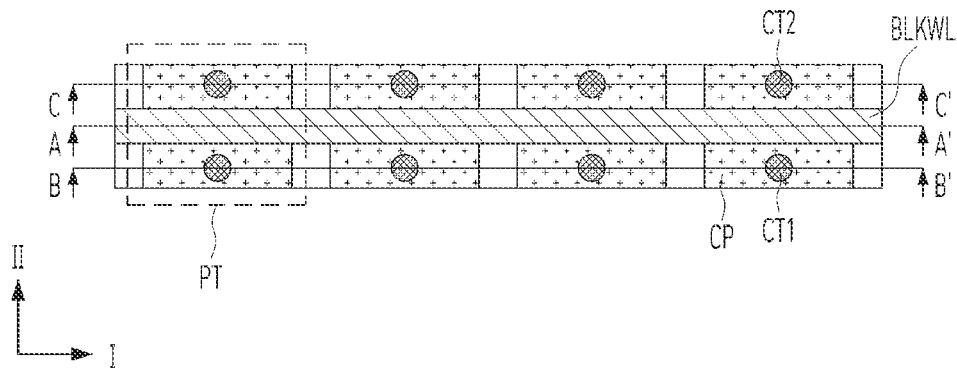

FIGS. 4A to 4D are diagrams illustrating a structure of a semiconductor device according to an embodiment of the present invention disclosure. FIG. 4D is a plan view, FIG. 4A is a cross-sectional view taken along a line A-A' of FIG. 4D, FIG. 4B is a cross-sectional view taken along a line B-B' of FIG. 4D, and FIG. 4C is a cross-sectional view taken along a line C-C' of FIG. 4D. Hereinafter, description of content already described earlier may be omitted.

Referring to FIGS. 4A to 4D, the semiconductor device may include at least one of a gate structure GST, channel patterns CP, a gate insulating layer GI, a block word line BLKWL, a capping layer 44, an interlayer insulating layer 45, a protective layer 48, first contact plugs CT1, second contact plugs CT2, and a third contact plug CT3.

The gate structure GST may include local lines LL and insulating layers 42 alternately stacked. The gate structure GST may not include a multi-step structure and a top surface of the gate structure GST may be flat.

The first contact plugs CT1 may extend through the gate structure GST and may be respectively connected to the local lines LL. The first contact plugs CT1 may extend to different depths into the gate structure GST. Insulating spacers SPC may respectively surround sidewalls of the first contact plugs CT1. The first contact plugs CT1 may be connected to lower surfaces of the channel patterns CP.

The channel patterns CP may be disposed over the gate structure GST. On a top surface of the gate structure GST, the channel patterns CP may be disposed to respectively correspond to the first contact plugs CT1. The channel patterns CP may be respectively connected to the first contact plugs CT1. The channel patterns CP may be disposed at substantially the same level.

The gate insulating layers GI may respectively surround the channel patterns CP. The gate insulating layer GI may be formed along a sidewall and a top surface of the channel pattern CP. A space between channel patterns CP adjacent in the first direction I may be filled with the gate insulating layers GI or may not be filled with the gate insulating layers GI. In the illustrated embodiment of FIG. 4B the gate insulating layers GI do not fill the space between adjacent channel patterns in the first direction I.

The block word line BLKWL may be disposed over the channel patterns CP. The block word line BLKWL may include at least one a first conductive layer 47A, a barrier layer 47B, and a second conductive layer 47C. The second conductive layer 47C may include a material having a lower specific resistance than that of the first conductive layer 47A. In an embodiment, the first conductive layer 47A may be made of or include polysilicon, and the second conductive layer 47C may be made or include a metal such as tungsten or molybdenum. The barrier layer 47B may be made of or include metal nitride such as titanium nitride, tantalum nitride, tungsten nitride, or molybdenum nitride.

The block word line BLKWL may surround a top surface and sidewalls of the channel pattern CP. The block word line BLKWL may protrude between the channel patterns CP. The block word line BLKWL may include protrusions PP protruding between the channel patterns CP as shown in FIG. 4A. The protrusions PP may contact the insulating layer 42. The block word line BLKWL may extend in the first direction I while surrounding the channel patterns CP.

The protective layer 48 may be disposed over the block word line BLKWL. The protective layer 48 may serve to protect the block word line BLKWL in a manufacturing process. In an embodiment, the protective layer 48 may be made of or include oxide and may reduce oxidation of the second conductive layer 47C including tungsten in the manufacturing process.

The capping layer 44 may be formed to at least partially surround the top surface and the sidewall of the block word line BLKWL. In an embodiment, the capping layer 44 may reduce oxidation of the first conductive layer 47A and the second conductive layer 47C exposed through the sidewall.

The second contact plugs CT2 may pass through the interlayer insulating layer 45, the capping layer 44, and the gate insulating layer GI, and may be respectively connected to the channel patterns CP. The second contact plugs CT2 may be connected to upper regions of the channel patterns CP. For example, as illustrated in FIG. 4C a bottom edge of the second contact plugs CT2 may be slightly inserted inside an upper region of a corresponding channel pattern CP.

The at least one third contact plug CT3 may pass through the interlayer insulating layer 45, the capping layer 44, and the protective layer 48, and may be connected to the block word line BLKWL.

According to the structure described above, pass transistors PT may be disposed over the gate structure GST. The pass transistors PT may be disposed at substantially the same level. The block word line BLKWL may protrude between the channel patterns CP, and an operation characteristic of the pass transistors PT may be improved.

Figure 5A:
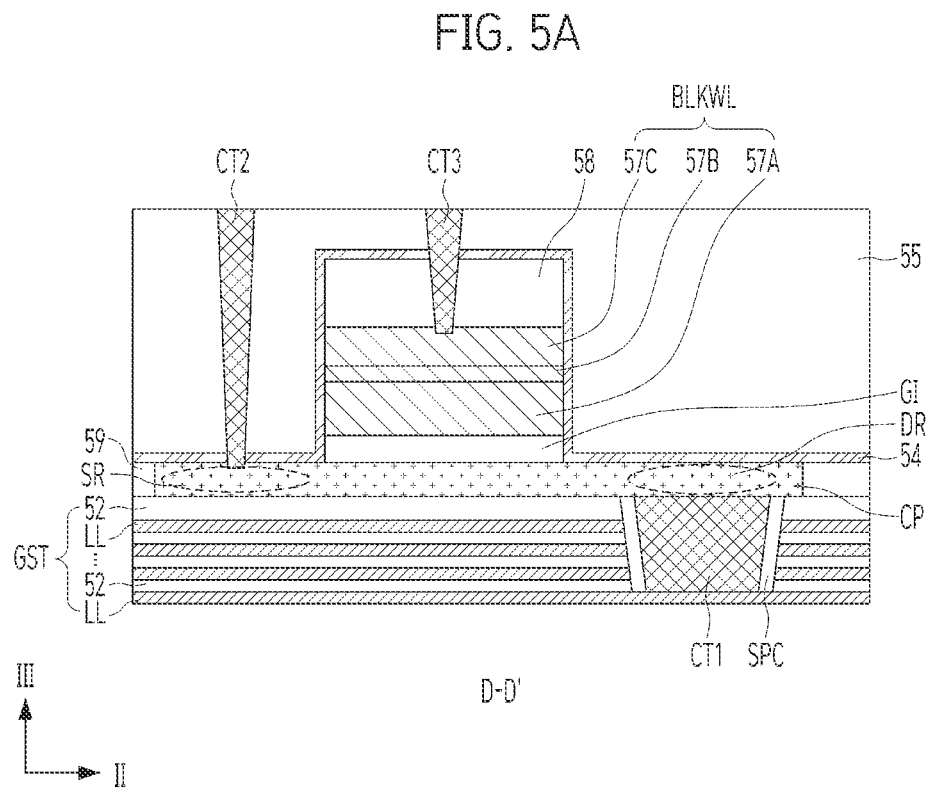
Figure 5B:
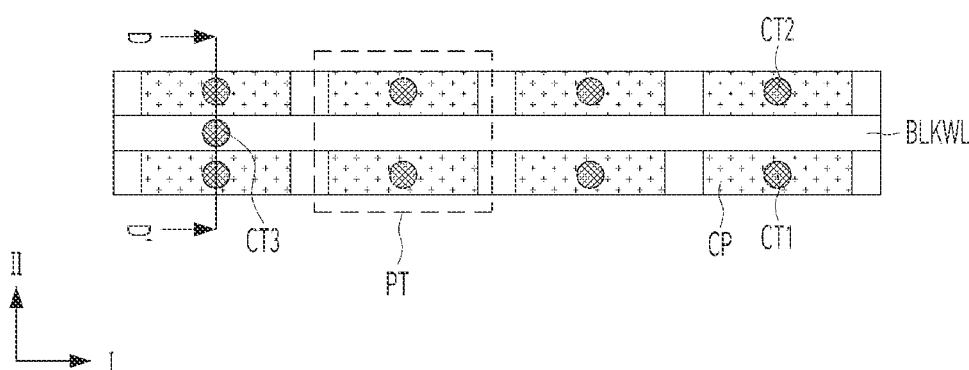

FIGS. 5A and 5B are diagrams illustrating a structure of a semiconductor device according to an embodiment of the present invention disclosure. FIG. 5B is a plan view, and FIG. 5A is a cross-sectional view taken along a line D-D' of FIG. 5B. Hereinafter, a description of a content overlapping the content described above may be omitted.

Referring to FIGS. 5A and 5B, the semiconductor device may include at least one gate structure GST, a channel pattern CP, a gate insulating layer GI, a block word line BLKWL, a capping layer 54, an interlayer insulating layer 55, a protective layer 58, an insulating layer 59, a first contact plug CT1, a second contact plug CT2, and a third contact plug CT3.

The gate structure GST may include local lines LL and insulating layers 52 alternately stacked. The gate structure GST may have a flat top surface and may not include a multi-step structure.

The semiconductor device may include a plurality of the first contact plugs CT1. The first contact plugs CT1 may extend through the gate structure GST and may be respectively connected to the local lines LL. The first contact plugs CT1 may extend to different depths into the gate structure GST. Insulating spacers SPC may respectively surround sidewalls of the first contact plugs CT1.

The channel patterns CP may be disposed over the gate structure GST. The channel patterns CP may be disposed over a top surface of the gate structure GST to respectively correspond to the first contact plugs CT1. The channel patterns CP may be respectively connected to the first contact plugs CT1. A lower surface of the channel pattern CP may be in contact with a top surface of the first contact plug CT1. The channel pattern CP may include a junction. In an embodiment, the channel pattern CP may include a source region SR and a drain region DR disposed over both sides of the block word line BLKWL. The source region SR and drain region DR may be regions doped with an N-type or P-type impurity at a high concentration.

The block word line BLKWL may be disposed over the channel patterns CP, may cross the channel patterns CP, and may extend in the first direction I. The gate insulating layers GI may be respectively disposed between the channel patterns CP and the block word line BLKWL. The block word line BLKWL may include at least one of a first conductive layer 57A, a barrier layer 57B, and a second conductive layer 57C. The second conductive layer 57C may include a material of which a specific resistance is lower than that of the first conductive layer 57A. The barrier layer 57B may be made of or include a metal nitride.

The protective layer 58 may be disposed over the block word line BLKWL. The protective layer 58 may serve to protect the block word line BLKWL in a manufacturing process, and may be made of or include oxide.

The capping layer 54 may be formed to at least partially surround a top surface and a sidewall of the block word line BLKWL. The capping layer 54 may be formed along a profile of the insulating layer 59, the channel pattern CP, the block word line BLKWL, and the protective layer 58. The capping layer 54 may reduce oxidation of the first conductive layer 57A and the second conductive layer 57C exposed through the sidewall.

The second contact plug CT2 may pass through the interlayer insulating layer 55 and the capping layer 54 and may be connected to the channel pattern CP. The third contact plug CT3 may pass through the interlayer insulating layer 55, the capping layer 54, and the protective layer 58, and may be connected to the block word line BLKWL.

According to the structure described above, pass transistor PT may be disposed over the gate structure GST. A plurality of pass transistors PT may be formed and may be disposed at substantially the same level. The pass transistors PT may have a planar shape.

Figure 6:
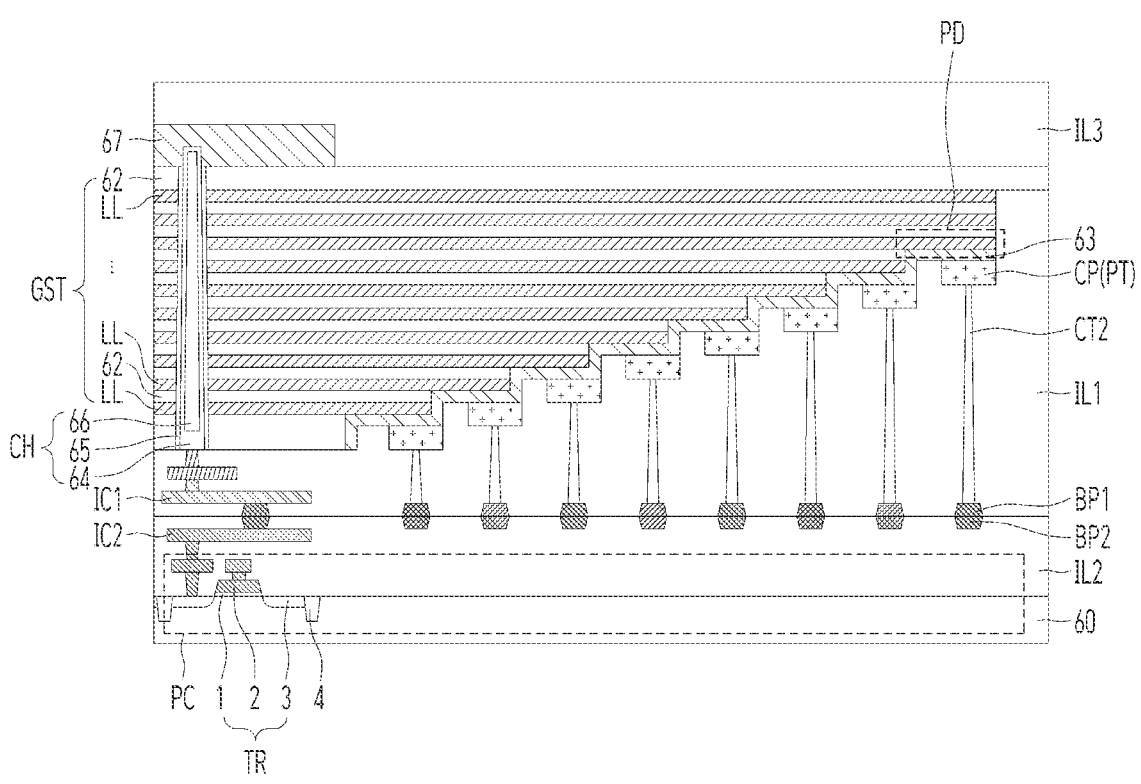
FIG. 6 is a diagram illustrating a structure of a semiconductor device according to an embodiment of the present invention disclosure.

FIG. 6 is a diagram illustrating a structure of a semiconductor device according to an embodiment of the present invention disclosure.

Referring to FIG. 6, the semiconductor device may include a gate structure GST, pass transistors PT, and second contact plugs CT2. The semiconductor device may further include a substrate 60, a peripheral circuit PC, a channel structure CH, a buffer layer 63, a source structure 67, a first interlayer insulating layer IL1, a second interlayer insulating layer IL2, a third interlayer insulating layer IL3, a first interconnection structure IC1, a second interconnection structure IC2, first bonding pads BP1, and second bonding pads BP2.

The gate structure GST may include local lines LL and insulating layers 62 alternately stacked. The gate structure GST may include a multi-step structure, and pads PD of the local lines LL may be exposed through the multi-step structure. The pass transistors PT may be disposed over the multi-step structure. The pass transistors PT may be respectively disposed over the pads PD. The pass transistor PT may include a channel pattern CP, a block word line, and a gate insulating layer. The buffer layer 63 may be disposed between the gate structure GST and the channel patterns CP. The second contact plugs CT2 may respectively connect the channel patterns CP and global lines. Here, the global lines may be disposed in the first interlayer insulating layer IL1 or may be disposed in the second interlayer insulating layer IL2.

The channel structure CH may pass through the gate structure GST. The channel structure CH may include at least one of a channel layer 64, a memory layer 65, and an insulating core 66. The source structure 67 may be disposed over the gate structure GST and the channel structure CH may extend into the source structure 67. The third interlayer insulating layer IL3 may be disposed over the source structure 67 and an uppermost insulating layer 62.

The peripheral circuit PC may be disposed over the substrate 60. The peripheral circuit PC may include a row decoder, a page buffer, a logic circuit, and the like. In an embodiment, an active region may be defined in the substrate 60 by an element isolation layer 4, and a transistor TR may be disposed in the active region. The transistor TR may include a gate insulating layer 1, a gate electrode 2, and junctions 3.

The first interconnection structure IC1 and the first bonding pad BP1 may be disposed in the first interlayer insulating layer IL1. The first interconnection structure IC1 may include a via, a line, and the like. The first interconnection structure IC1 may be electrically connected to the channel structure CH, the pass transistor PT, and the like. The second interconnection structure IC2 and the second bonding pad BP2 may be disposed in the second interlayer insulating layer IL2. The second interconnection structure IC2 may include a via, a line, and the like. The second interconnection structure IC2 may be electrically connected to the peripheral circuit PC.

According to the structure described above, a cell array and the peripheral circuit PC may be electrically connected through the first and second bonding pads BP1 and BP2. Because the pass transistors PT are disposed over the multi-step structure instead of on the substrate 60, the area where the peripheral circuit PC is to be formed on the substrate 60 may be sufficiently secured.

Meanwhile, in the present figure, a case where the gate structure GST includes an inverted multi-step structure is shown, but the gate structure GST may include a forward direction of multi-step structure. In this case, the peripheral circuit PC and the gate structure GST may be sequentially stacked on the substrate, and a bonding pad may be omitted.

Figure 7:
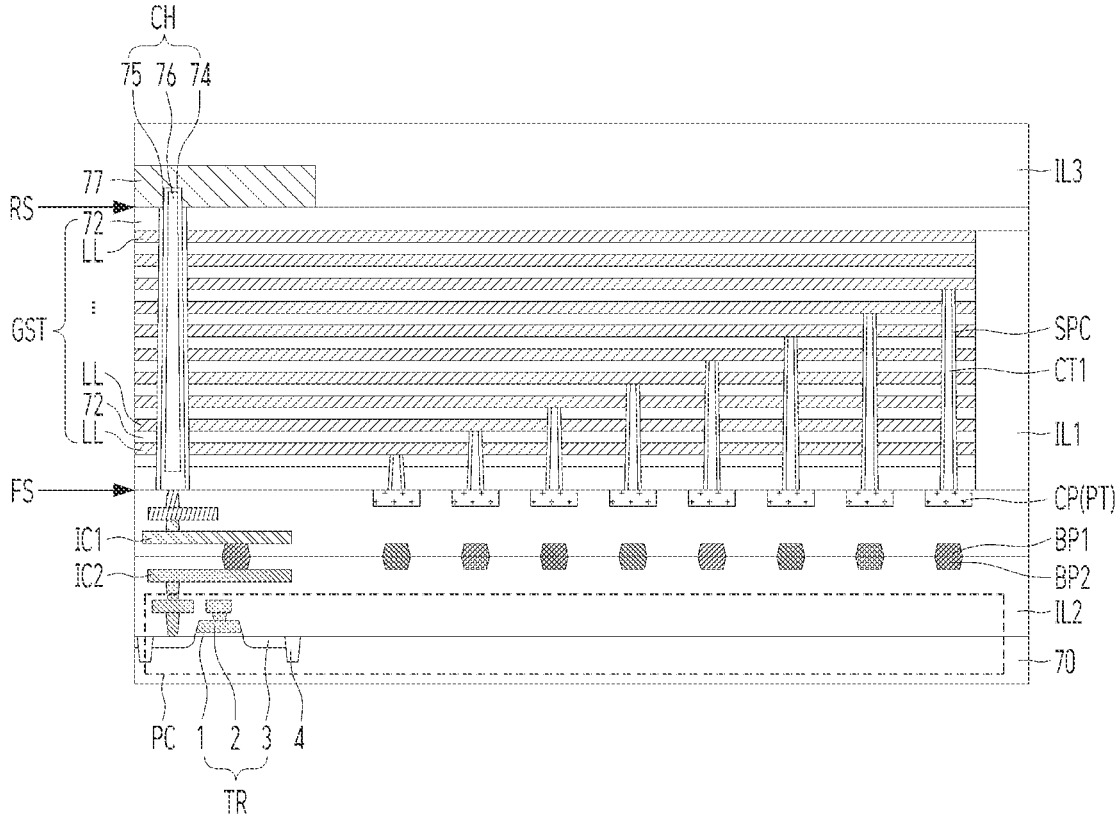
FIG. 7 is a diagram illustrating a structure of a semiconductor device according to an embodiment of the present invention disclosure.

FIG. 7 is a diagram illustrating a structure of a semiconductor device according to an embodiment of the present invention disclosure.

Referring to FIG. 7, the semiconductor device may include a gate structure GST, pass transistors PT, first contact plugs CT1, and an insulating spacer SPC. The semiconductor device may further include a substrate 70, a peripheral circuit PC, a channel structure CH, a source structure 77, a first interlayer insulating layer IL1, a second interlayer insulating layer IL2, a third interlayer insulating layer IL3, a first interconnection structure IC1, a second interconnection structure IC2, a first bonding pad BP1, and a second bonding pad BP2.

The gate structure GST may include local lines LL and insulating layers 72 alternately stacked. The first contact plugs CT1 may extend toward a rear surface RS through a front surface FS of the gate structure GST, and may be electrically connected to the local lines LL, respectively. Insulating spacers SPC may respectively surround sidewalls of the first contact plugs CT1.

The pass transistors PT may be disposed over the front surface FS of the gate structure GST to correspond to the first contact plugs CT1. The pass transistors PT may each include a channel pad CP, a block word line, and a gate insulating layer. The first contact plugs CT1 may respectively connect the channel patterns CP and the local lines LL.

The channel structure CH may pass through the gate structure GST. The channel structure CH may include at least one of a channel layer 74, a memory layer 75, and an insulating core 76. The source structure 77 may be disposed over the gate structure GST, and the channel structure CH may extend into the source structure 77. The third interlayer insulating layer IL3 may be disposed over the source structure 77 and an uppermost insulating layer 72.

The peripheral circuit PC may be disposed over the substrate 70. The peripheral circuit PC may include a row decoder, a page buffer, a logic circuit, and the like. In an embodiment, an active region may be defined in the substrate 70 by an element isolation layer 4, and a transistor TR may be disposed in the active region. The transistor TR may include a gate insulating layer 1, a gate electrode 2, and junctions 3.

The first interconnection structure IC1 and the first bonding pads BP1 may be disposed in the first interlayer insulating layer IL1. The first interconnection structure IC1 may include a via, a line, and the like. The first interconnection structure IC1 may be electrically connected to the channel structure CH, the pass transistors PT, and the like. The second interconnection structure IC2 and the second bonding pads BP2 may be disposed in the second interlayer insulating layer IL2. The second interconnection structure IC2 may include a via, a line, and the like. The second interconnection structure IC2 may be electrically connected to the peripheral circuit PC.

According to the structure described above, a cell array and the peripheral circuit PC may be electrically connected through the first bonding pad BP1 and the second bonding pad BP2. Because the pass transistors PT are disposed over the front surface FS of the gate structure GST instead of on the substrate 70, the area where the peripheral circuit PC is to be formed on the substrate 70 may be sufficiently secured.

FIGS. 8, 9A, 9B, 10A to 10C, 11A to 11C, 12A to 12C, 13A to 13D, and 14A to 14D are diagrams illustrating a method of manufacturing a semiconductor device according to an embodiment of the present invention disclosure. Each figure may be a plan view or a cross-sectional view. Hereinafter, a description of a content overlapping the content described above may be omitted.

Figure 8:
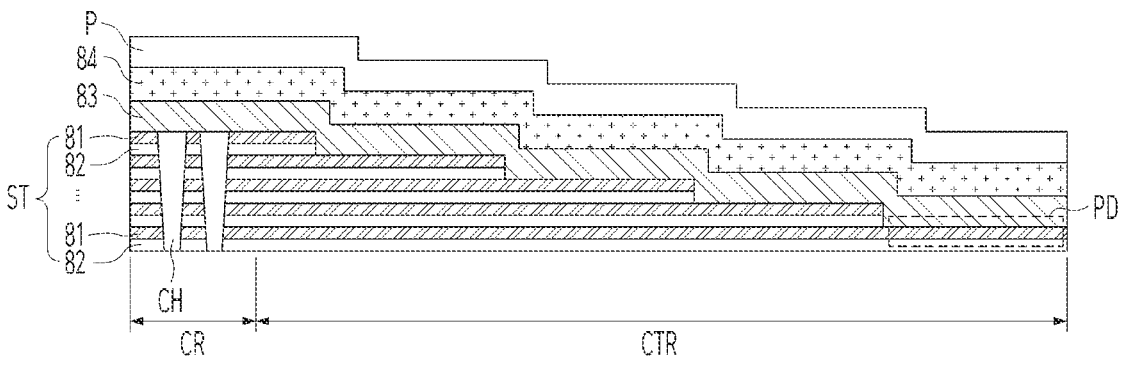
FIGS. 8, 9A, 9B, 10A to 10C, 11A to 11C, 12A to 12C, 13A to 13D, and 14A to 14D are diagrams illustrating a method of manufacturing a semiconductor device according to an embodiment of the present invention disclosure.

Referring to FIG. 8, a stack including first material layers 81 and second material layers 82 alternately stacked may be formed. The first material layers 81 may be used for forming local lines. The second material layers 82 may be used for insulating the stacked local lines from each other. The first material layers 81 may be made of or include a material having a high etch selectivity with respect to the second material layers 82. The first material layers 81 may be made of or include a sacrificial material such as nitride or may be made of or include a conductive material such as for example, polysilicon, tungsten, or molybdenum. The second material layers 82 may be made of or include an insulating material such as oxide, nitride, or void.

The stack ST may include a cell region and a contact region. The cell region CR may be a region where memory cells are to be stacked, and the contact region CTR may be a region where an interconnection structure for transferring a driving voltage to the stacked memory cells is to be disposed.

Subsequently, channel structures CH may be formed in the stack ST. The channel structures CH may pass through the cell region CR of the stack ST. Subsequently, a multi-step structure may be formed in the stack ST. The multi-step structure may be formed in the contact region CTR of the stack ST. Each of the first material layers 81 may be exposed through the multi-step structure. A portion of the first material layers 81 exposed by the multi-step structure may be defined as a pad PD.

Subsequently, a buffer layer 83 may be formed on the stack ST. The buffer layer 83 may be formed in the cell region CR and the contact region CTR. The buffer layer 83 may be formed along a profile of the multi-step structure. The buffer layer 83 may be made of or include an insulating material such as oxide or nitride.

Subsequently, a channel layer 84 may be formed on the buffer layer 83. The channel layer 84 may be formed along the profile of the multi-step structure. The channel layer 84 may be made of or include a semiconductor material such as for example, polysilicon, silicon germanium, germanium, or gallium arsenide.

Subsequently, a pad layer P may be formed on the channel layer 84. The pad layer P may be formed along the profile of the multi-step structure, and may be formed in a method in which a step coverage is bad. Uniformity of a thickness of the pad layer P may be lower than that of the buffer layer 83. The pad layer P may include a horizontal portion extending in a horizontal direction and a vertical portion extending in a vertical direction, and may be formed to have a smaller thickness in the vertical portion compared to the horizontal portion.

Figure 9A:
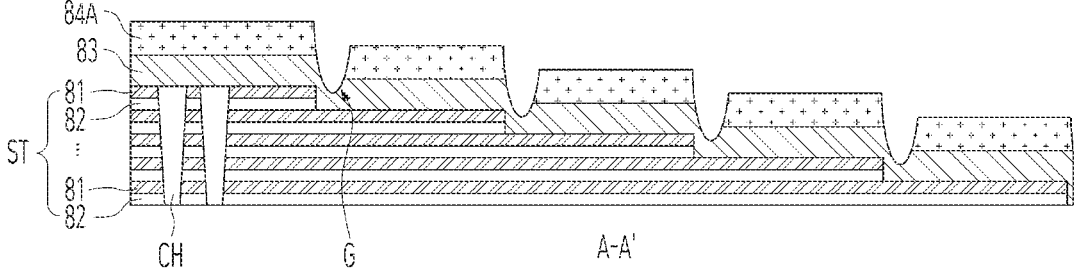
Figure 9B:
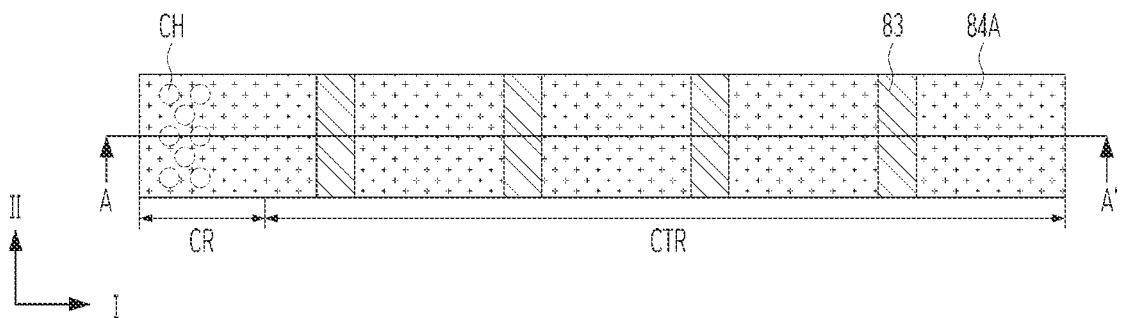

Referring to FIGS. 9A and 9B, channel patterns 84A may be formed. In an embodiment, the pad layer P and the channel layer 84 may be etched in a wet etching method. Because the pad layer P has a relatively small thickness in the vertical portion, the vertical portion is etched first to expose the channel layer 84. Therefore, the vertical portion of the channel layer 84 may be etched first and the horizontal portions may remain. Through this, the channel patterns 84A disposed to be spaced apart from each other on the multi-step structure may be formed. The channel patterns 84A may be disposed over each step and may be adjacent to each other in the first direction I. In a process of forming the channel patterns 84A, the buffer layer 83 may be partially etched. A groove G disposed between the channel patterns 84A and extending in the second direction II may be formed on a top surface of the buffer layer 83.

Subsequently, a well region may be formed in the channel patterns 84A. In an embodiment, the well region may be formed by doping a P-type of impurity. A process of forming the well region may be omitted.

Figure 10A:
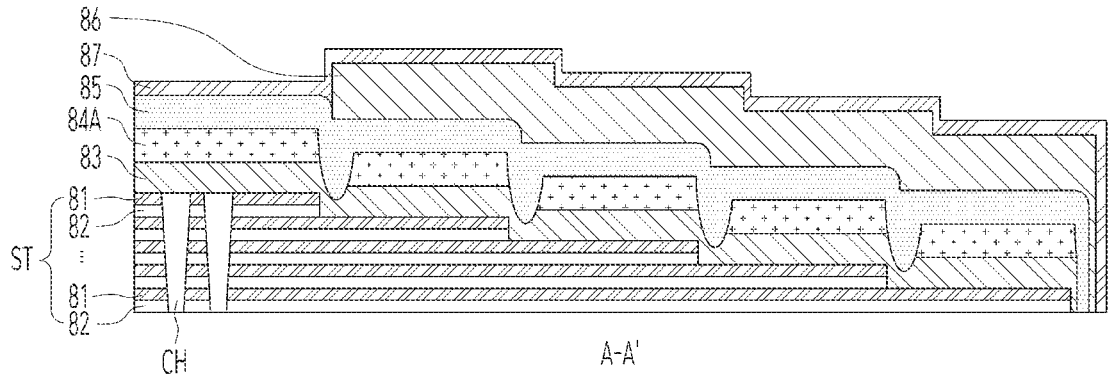
Figure 10B:
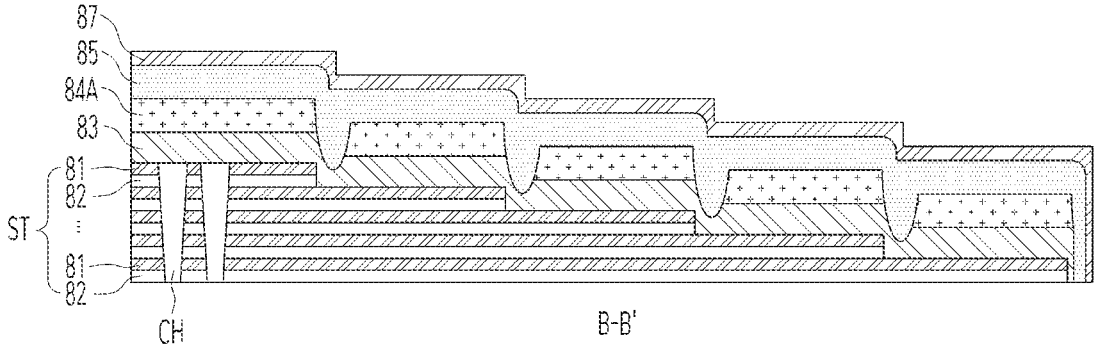
Figure 10C:
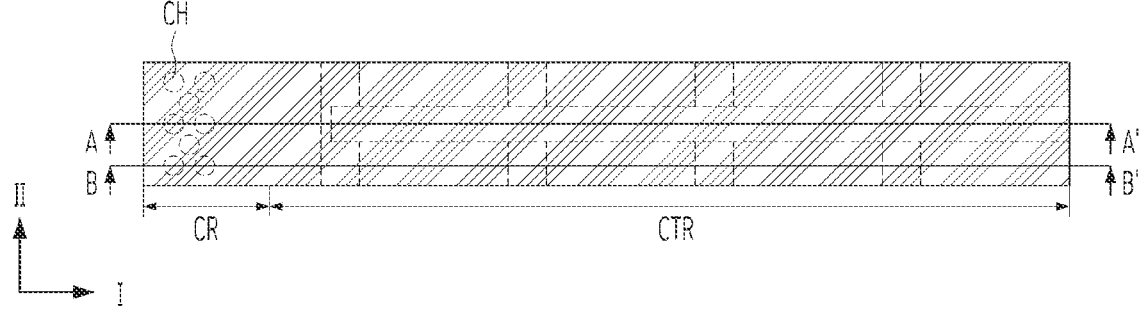

Referring to FIGS. 10A to 10C, a gate insulating layer 85 may be formed on the channel patterns 84A. In an embodiment, the gate insulating layer 85 may be formed in an oxidation process. Through the oxidation process, a surface of the channel patterns 84A may be oxidized to form the gate insulating layer 85.

Subsequently, a block word line 86 may be formed on the gate insulating layer 85. First, a conductive layer may be formed on the gate insulating layer 85, and the conductive layer may be etched to form the block word line 86. The block word line 86 may be disposed in a contact region and may extend in the first direction I along a multi-step profile. In an embodiment, the block word line 86 may include polysilicon and metal. The metal may include titanium, tungsten, molybdenum, tungsten nitride, tungsten silicon nitride, or the like.

Subsequently, a junction may be formed in the channel patterns 84A by doping with an N-type or P-type of impurity. The junction may be disposed over both sides of the block word line 86. In an embodiment, a process of forming the junction may be omitted.

Subsequently, an etch stop layer 87 may be formed on the block word line 86. The etch stop layer 87 may be for controlling a depth at which a contact plug is formed in a subsequent process, and may include silicon carbon nitride (SiCN).

Figure 11A:
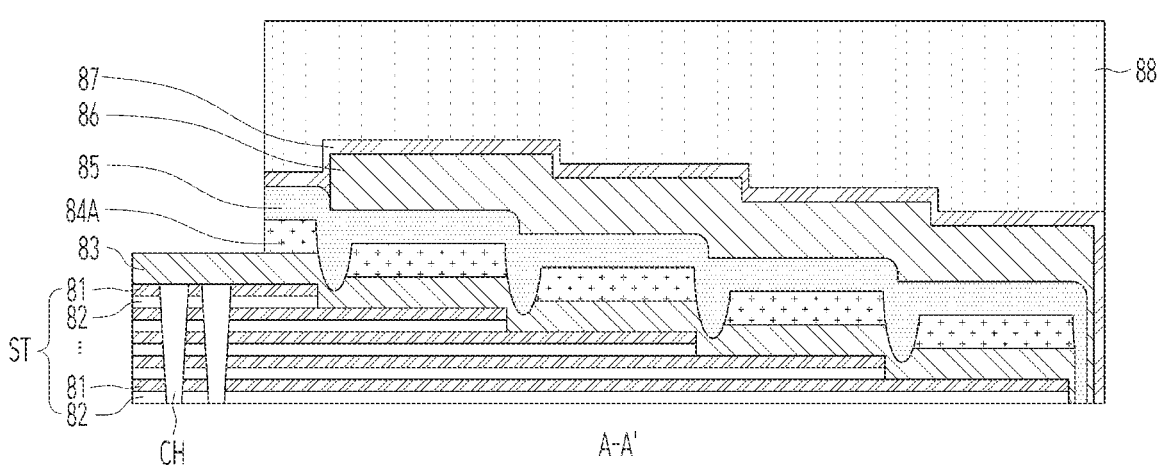
Figure 11B:
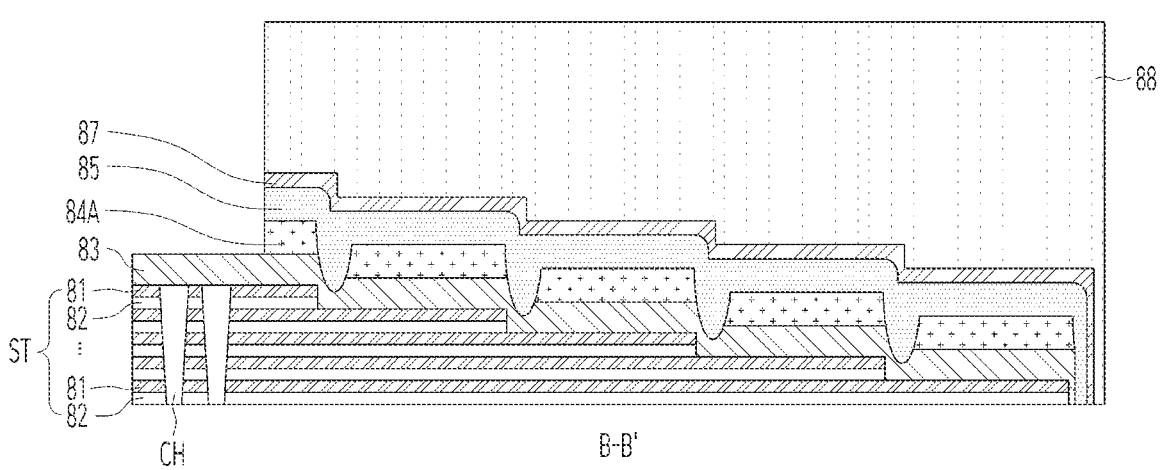
Figure 11C:
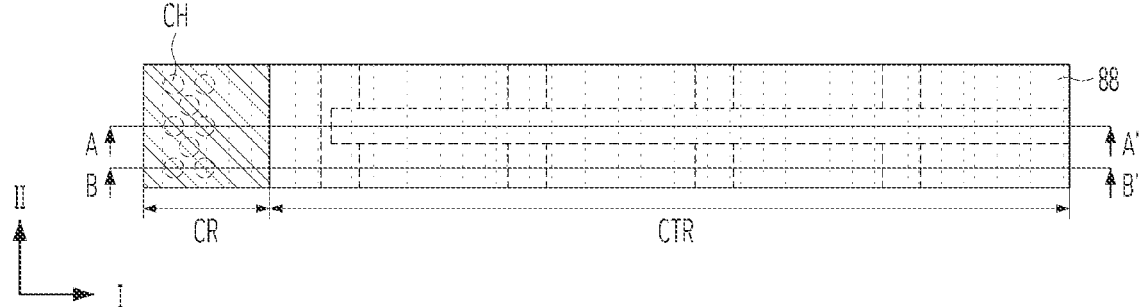

Referring to FIGS. 11A to 11C, a mask pattern 88 may be formed on the etch stop layer 87. The mask pattern 88 may cover the contact region CTR and expose the cell region CR. Subsequently, the etch stop layer 87, the gate insulating layer 85, and the channel pattern 84A may be etched using the mask pattern 88 as an etch barrier. Subsequently, the mask pattern 88 may be removed, and a cleaning process may be performed.

Figure 12A:
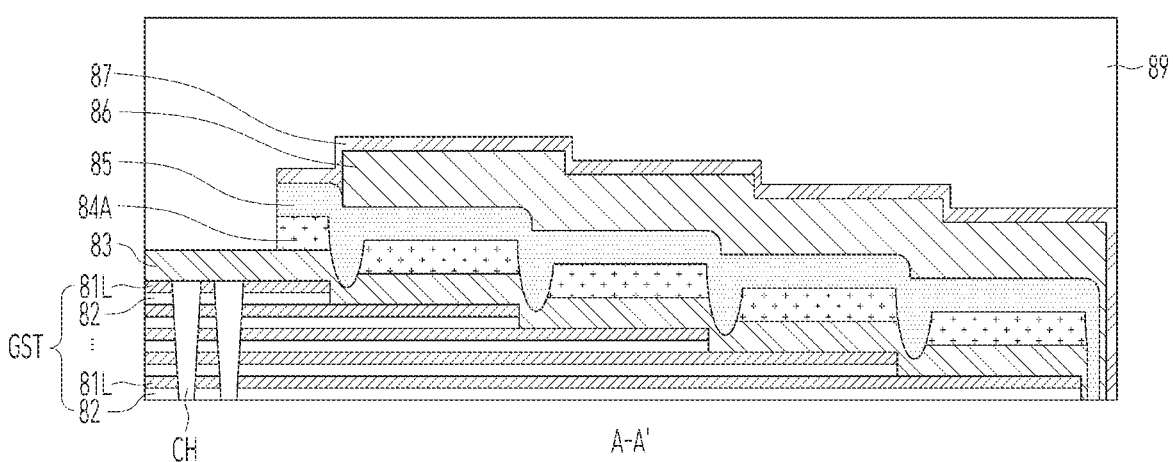
Figure 12B:
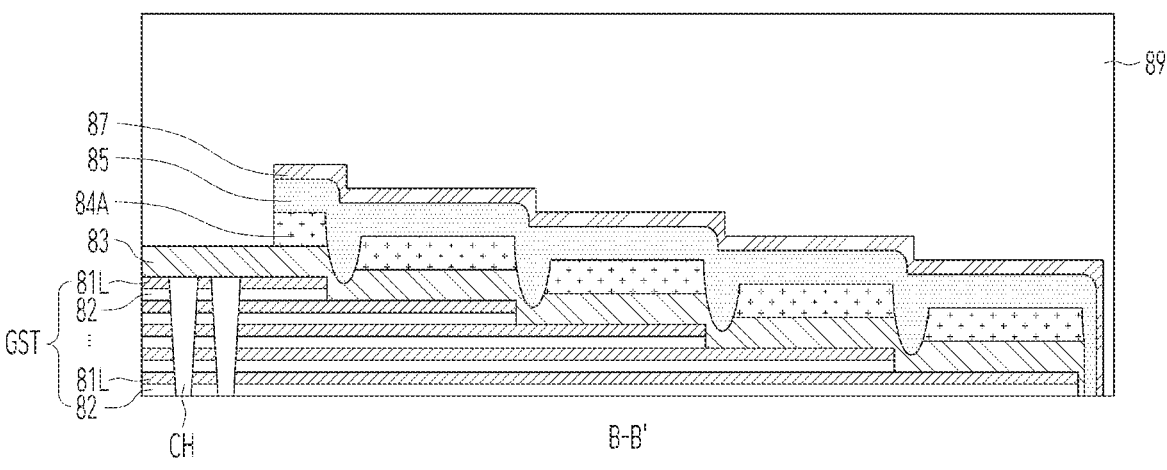
Figure 12C:
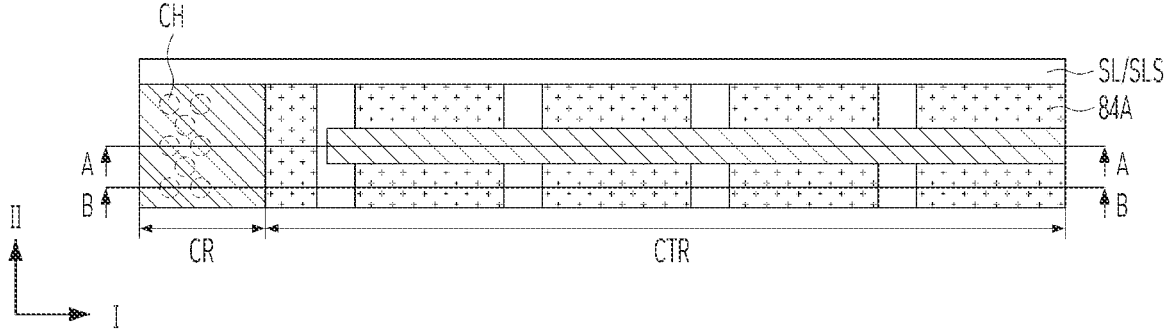
Figure 13A:
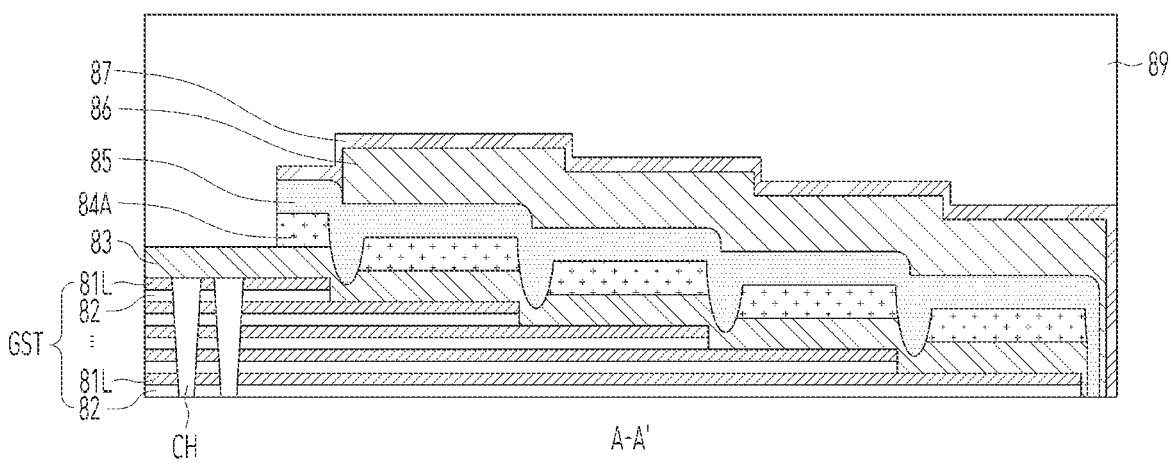
Figure 13B:
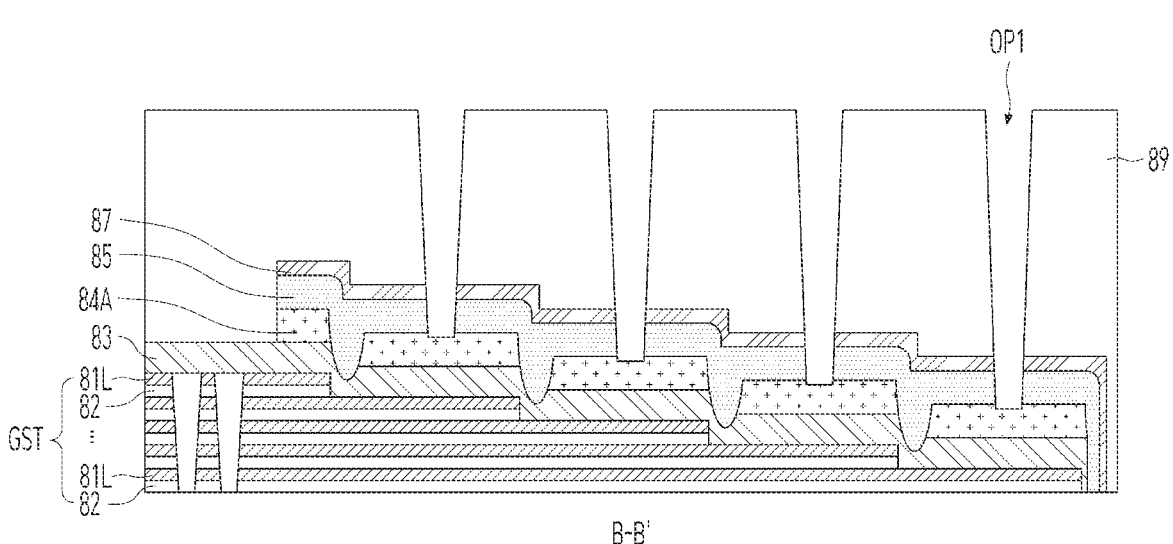
Figure 13C:
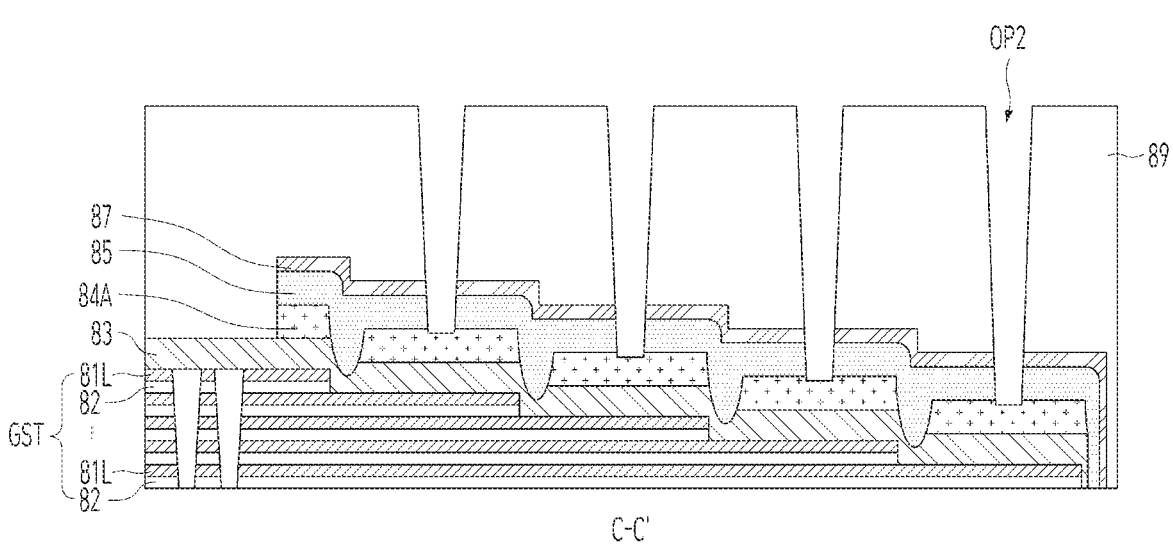
Figure 13D:
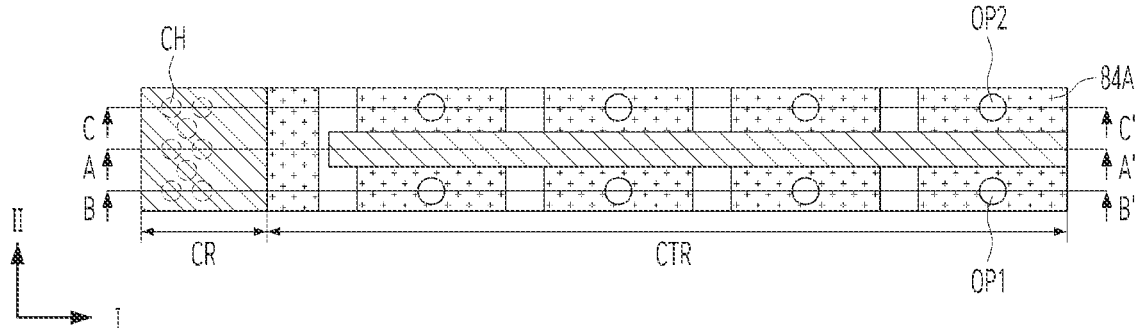
Figure 14A:
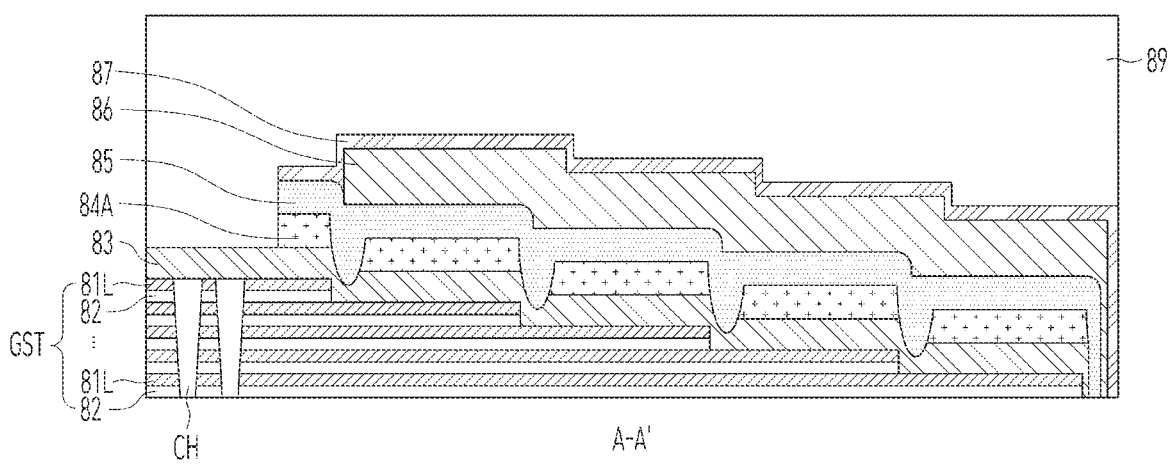
Figure 14B:
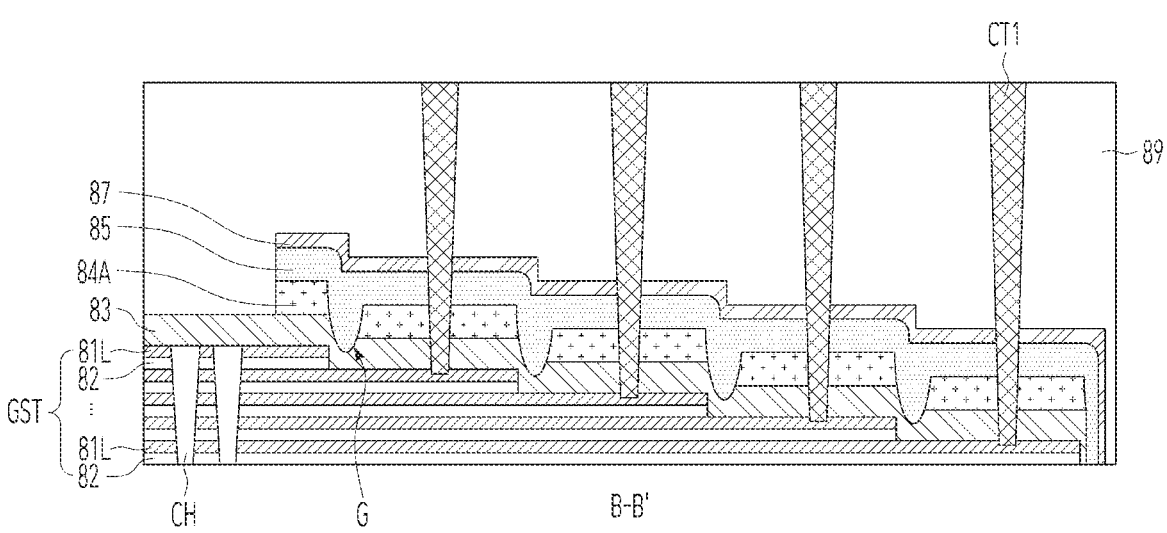
Figure 14C:
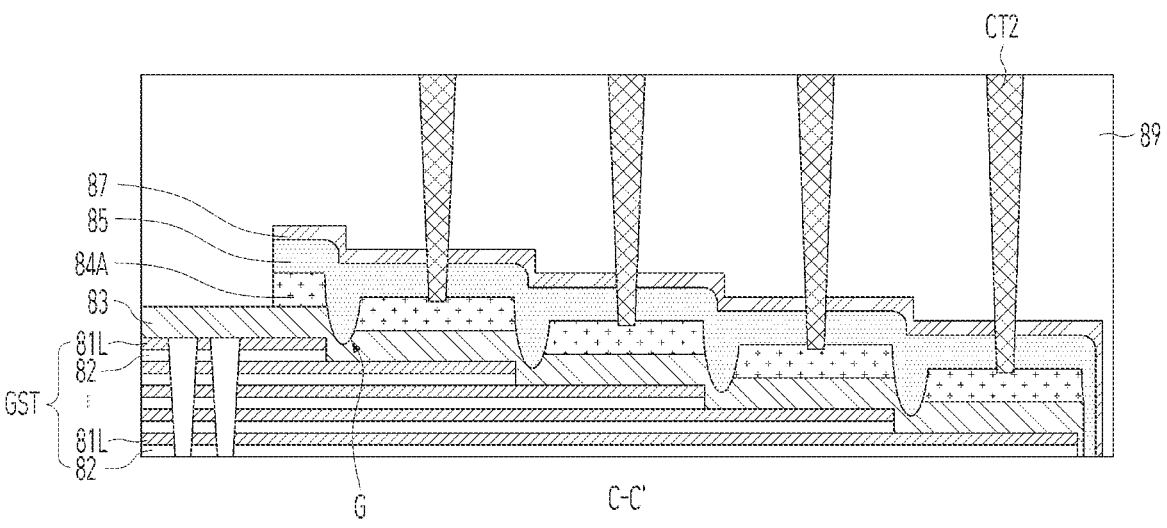
Figure 14D:
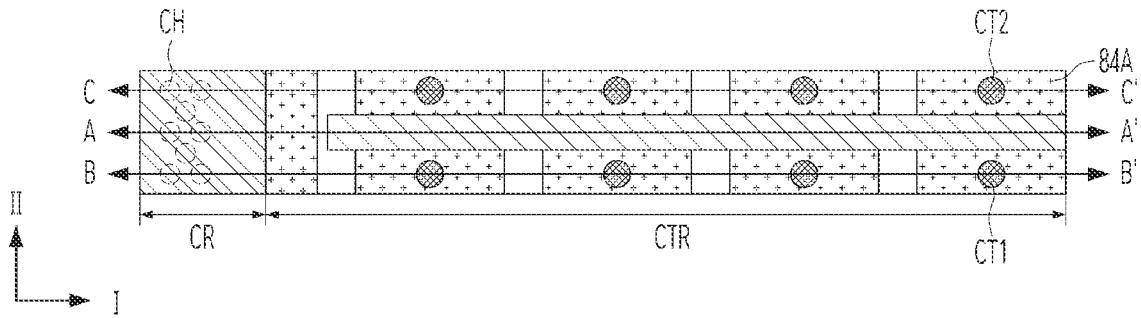

Referring to FIGS. 12A to 12C, an interlayer insulating layer 89 may be formed. Subsequently, the first material layers 81 may be replaced with local lines 81L. In an embodiment, after forming a slit SL extending in the first direction I through the stack ST, the first material layers 81 may be removed through the slit SL. Subsequently, the local lines 81L may be formed in regions where the first material layers 81 are removed. The local lines 81L may include metal such as tungsten and molybdenum. Through this, a gate structure GST including the local lines 81L and the second material layers 82 alternately stacked may be formed. Subsequently, a slit structure SLS may be formed in the slit SL. The slit structure SLS may include at least one of an insulating material, a semiconductor material, and a conductive material.

For reference, when the first material layers 81 include a conductive material, the replacement process may be omitted. In this case, the first material layers 81 may be used as the local lines 81L, and the stack ST may be formed as the gate structure GST.

Referring to FIGS. 13A to 13D, first openings OP1 may be formed. The first openings OP1 may be disposed over one side of the block word line 86. The first openings OP1 may pass through the interlayer insulating layer 89, the etch stop layer 87, and the gate insulating layer 85, and may expose the channel pattern 84A. In an embodiment, a preliminary first opening may be formed to expose a surface of the etch stop layer 87. The etch stop layer 87 may include a material with a high etch selectivity with respect to the interlayer insulating layer 89, and a depth of the first preliminary opening may be adjusted using the etch selectivity. Subsequently, the first opening OP1 exposing the channel pattern 84A may be formed by extending the preliminary first opening downwardly.

Second openings OP2 may be formed. The second openings OP2 may be disposed over another side of the block word line 86. The first opening OP1 and the second opening OP2 may be adjacent to each other in the second direction II with the block word line 86 interposed therebetween. The second openings OP2 may pass through the interlayer insulating layer 89, the etch stop layer 87, and the gate insulating layer 85, and may expose the channel patterns 84A. In an embodiment, after forming a second preliminary opening to expose the surface of the etch stop layer 87, the second opening OP2 may be formed by extending the second preliminary opening downwardly. When forming the preliminary first openings, the preliminary second openings may be formed. In addition, when forming the first openings OP1, the second openings OP2 may be formed.

Referring to FIGS. 14A to 14D, the first openings OP1 may extend downwardly. In an embodiment, a mask pattern covering the second openings OP2 and exposing the first openings OP1 may be formed on the interlayer insulating layer 89. Subsequently, the channel pattern 84A may be etched using the mask pattern as an etch barrier to extend the first openings OP1 downwardly. Through this, the first openings OP1 may be selectively extended to a depth respectively exposing the pads PD of the local lines 81L. Subsequently, the mask pattern may be removed.

Subsequently, first contact plugs CT1 may be formed in the first openings OP1. The first contact plugs CT1 may pass through the channel pattern 84A and may be connected to corresponding pads PD of the local lines 81L. The first contact plugs CT1 may pass through the channel pattern 84A and may connect the channel patterns 84A and the local lines 81L. In an embodiment, a barrier metal layer may be formed, and a gap-fill metal layer may be formed in the barrier metal layer. The barrier metal layer may be made of or include a metal nitride, and the gap-fill metal layer may include tungsten, molybdenum, or the like.

Second contact plugs CT2 may be formed in the second openings OP2. The second contact plugs CT2 may be respectively connected to the channel patterns 84A. The second contact plug CT2 may connect the channel pattern 84A and the global line. In an embodiment, a barrier metal layer may be formed, and a gap-fill metal layer may be formed in the barrier metal layer. The barrier metal layer may be made of or include a metal nitride, and the gap-fill metal layer may include tungsten, molybdenum, or the like. When forming the first contact plugs CT1, the second contact plugs CT2 may be formed.

According to the manufacturing method described above, pass transistors disposed in a region where the channel patterns 84A and the block word line 86 cross may be formed. The pass transistors may be disposed over a multi-step structure and may be disposed at different levels. A junction of the pass transistor and the local line 81L may be connected through the first contact plug CT1, and the junction of the pass transistor and a global line may be connected through the second contact plug CT2.

Meanwhile, although not shown in the present figure, a wafer bonding process may be additionally performed. After forming a first wafer including a cell array and a pass transistor and a second wafer including a peripheral circuit, the first wafer and the second wafer may be bonded. Because the pass transistors are formed on the multi-step structure of the first wafer, the area where the peripheral circuit is to be formed on the second wafer may be sufficiently secured.

Figure 15A:
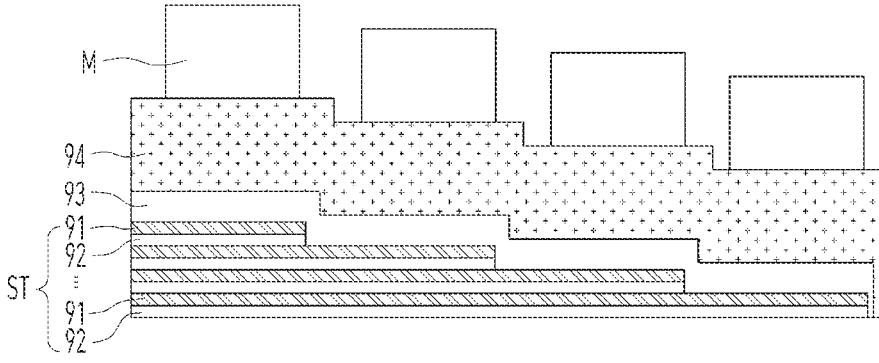
FIGS. 15A to 15C are diagrams illustrating a method of manufacturing a semiconductor device according to an embodiment of the present invention disclosure.
Figure 15B:
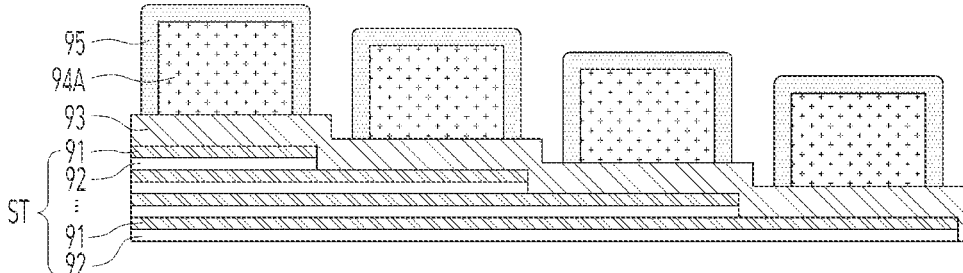
Figure 15C:
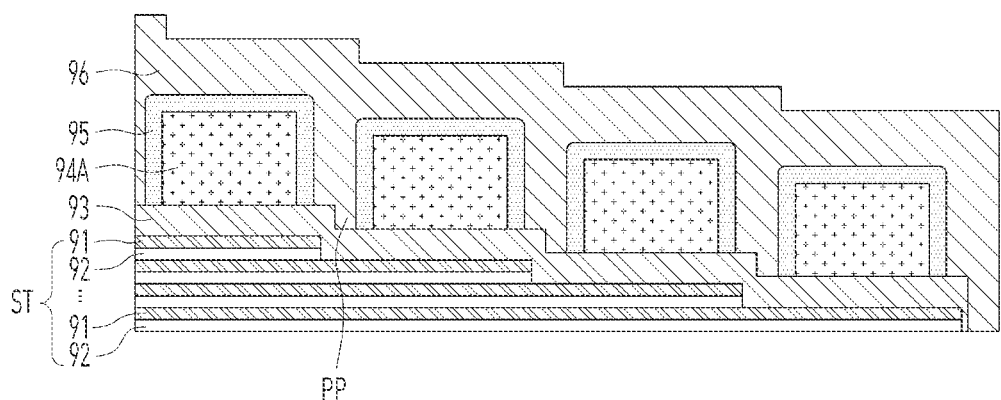

FIGS. 15A to 15C are diagrams illustrating a method of manufacturing a semiconductor device according to an embodiment of the present invention disclosure. Hereinafter, a description of a content overlapping the content described above may be omitted.

Referring to FIG. 15A, a stack including first material layers 91 and second material layers 92 alternately stacked may be formed. Subsequently, a multi-step structure may be formed in the stack ST. Each of the first material layers 91 may be exposed through the multi-step structure. Subsequently, a buffer layer 93 may be formed on the stack ST, and a channel layer 94 may be formed on the buffer layer 93. Subsequently, a mask pattern M may be formed on the channel layer 94.

Referring to FIG. 15B, channel patterns 94A may be formed by etching the channel layer 94 using the mask pattern M as an etch barrier. The channel patterns 94A may be disposed over each step. Subsequently, gate insulating layers 95 may be formed on the channel patterns 94A. In an embodiment, the gate insulating layers 95 may be formed in an oxidation process. Through an oxidation process, top surfaces and sidewalls of the channel patterns 94A may be oxidized, and the gate insulating layers 95 respectively surrounding the channel patterns 94A may be formed.

Subsequently, a block word line 96 may be formed. A conductive layer may be formed on the gate insulating layers 95 and the block word line 96 may be formed by etching the conductive layer. The block word line 96 may include protrusions PP protruding between the channel patterns 94A, and may surround the top surfaces and the sidewalls of the channel patterns 94A.

Subsequently, as described above with reference to FIGS. 10A to 10C, 11A to 11A to 11C, 12A to 12C, 13A to 13D, and 14A to 14D, the etch stop layer may be formed on the block word line 96, and the first contact plugs and the second contact plugs may be formed.

According to the manufacturing method described above, pass transistors disposed in a region where the channel patterns 94A and the block word line 96 cross may be formed. The block word line 96 may be formed to surround the top surfaces and the sidewalls of the channel patterns 94A, and the pass transistors may have a Fin-type of structure.

FIGS. 16, 17A to 17C, and 18A to 18D are diagrams illustrating a manufacturing method according to an embodiment of the present invention disclosure. Hereinafter, a description of a content overlapping the content described above may be omitted.

Figure 16:
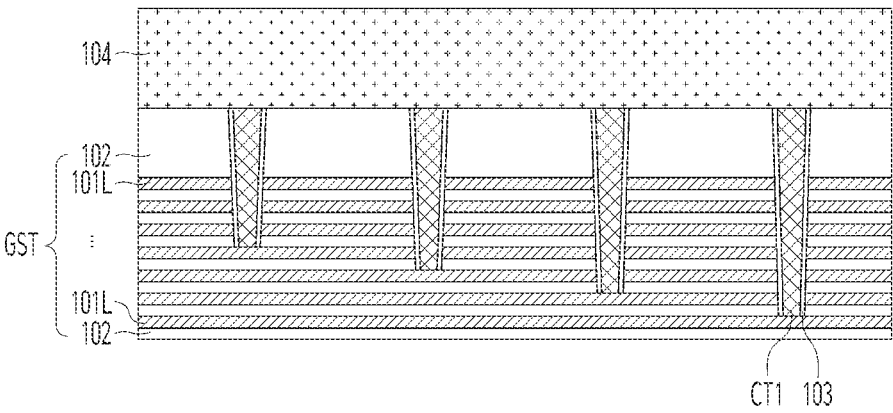
FIGS. 16, 17A to 17C, and 18A to 18D are diagrams illustrating a manufacturing method according to an embodiment of the present invention disclosure.

Referring to FIG. 16, a gate structure GST including local lines 101L and insulating layers 102 alternately stacked may be formed. Subsequently, first contact plugs CT1 extending through the gate structure GST and respectively connected to the local lines 101L may be formed. Insulating spacers 103 may respectively surround sidewalls of the first contact plugs CT1. For reference, in the present figure, for convenience of description, only a portion of the first contact plugs CT1 is shown.

Subsequently, a channel layer 104 may be formed on the gate structure GST. The channel layer 104 may be made of or include silicon germanium, germanium, polysilicon, gallium arsenide, or the like.

Figure 17A:
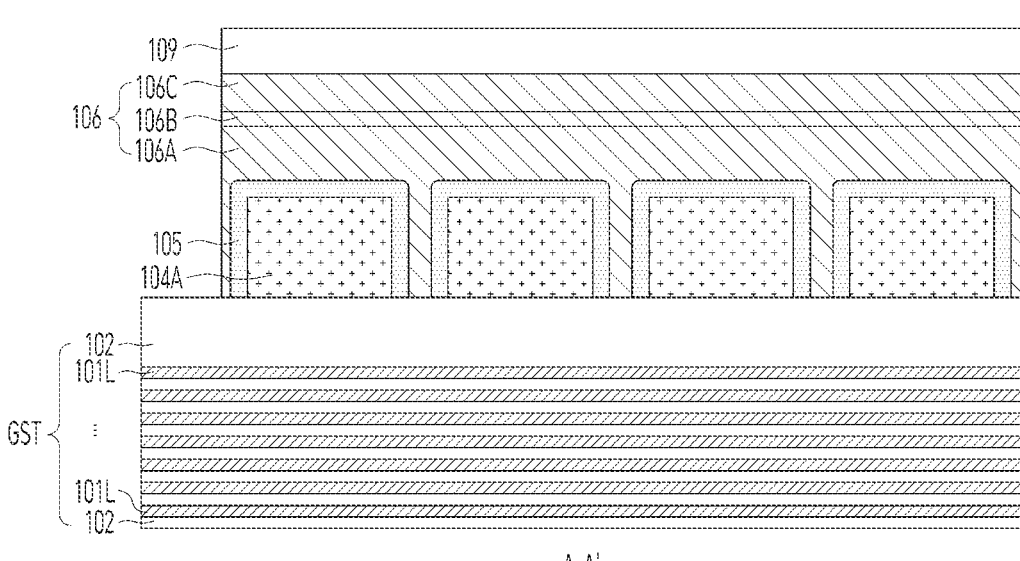
Figure 17B:
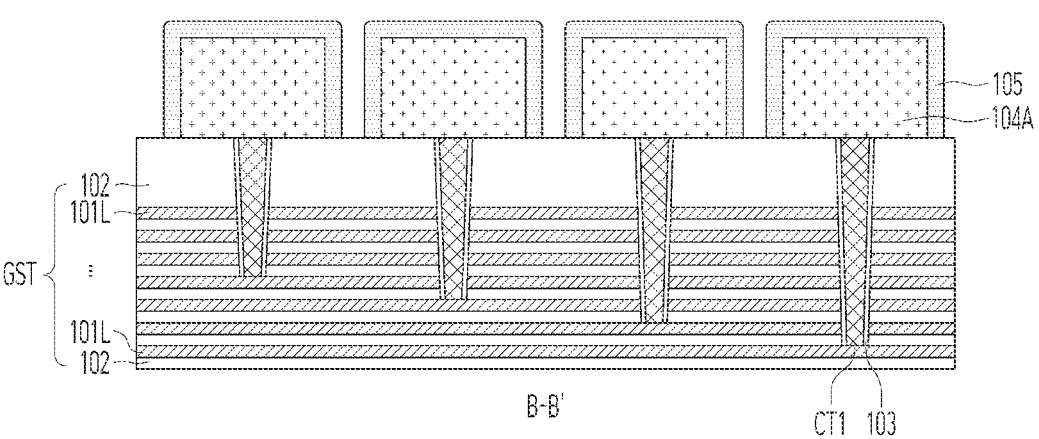
Figure 17C:
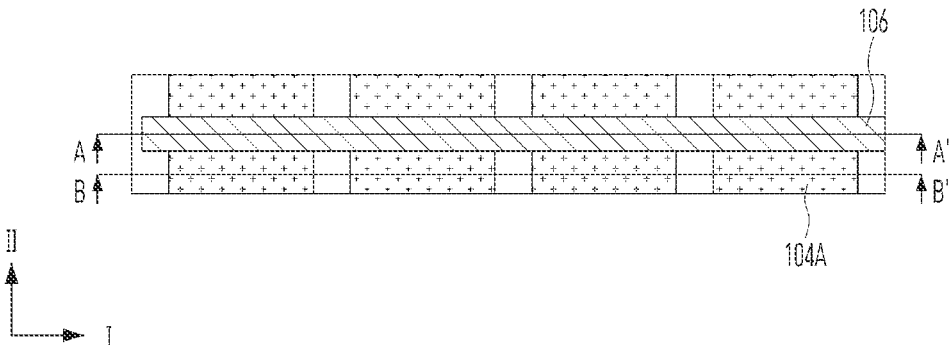
Figure 18A:
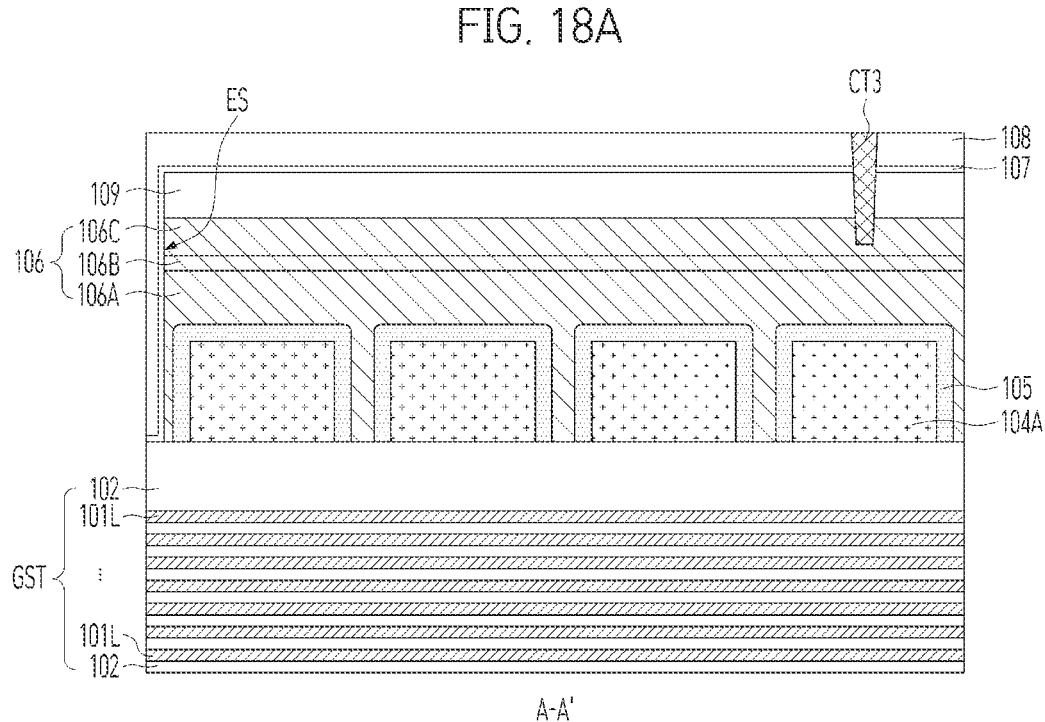
Figure 18B:
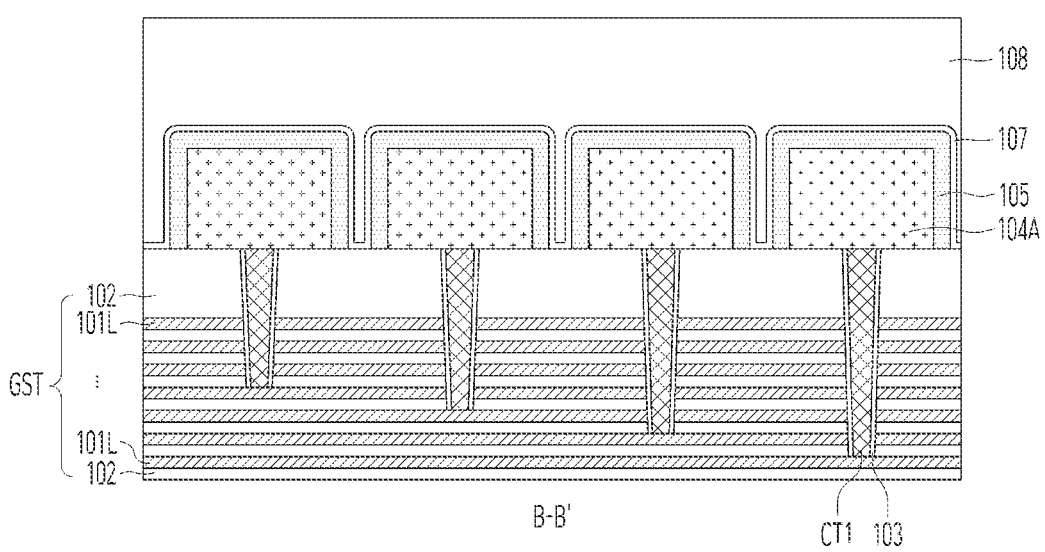
Figure 18C:
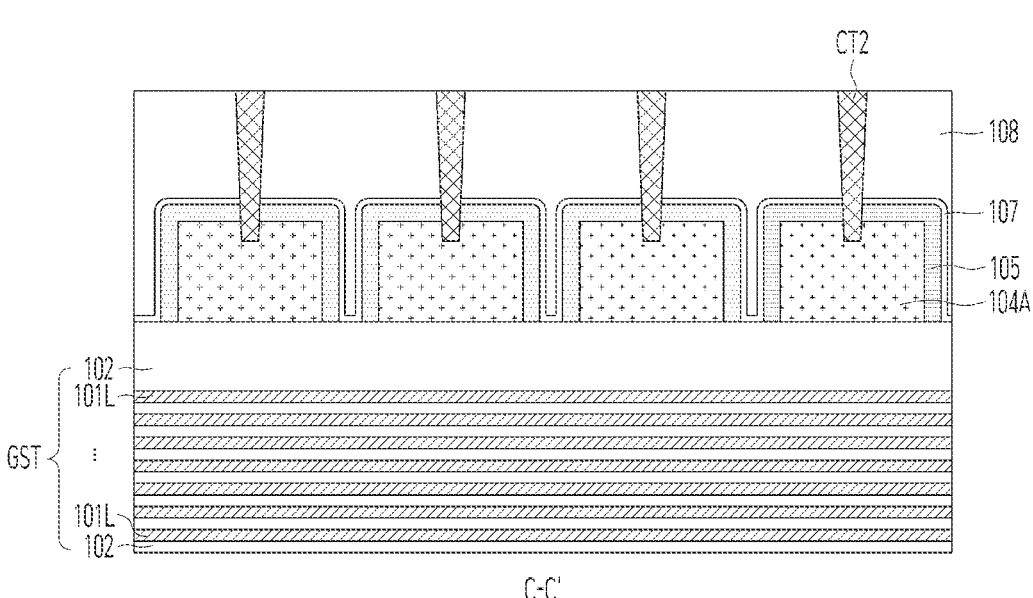
Figure 18D:
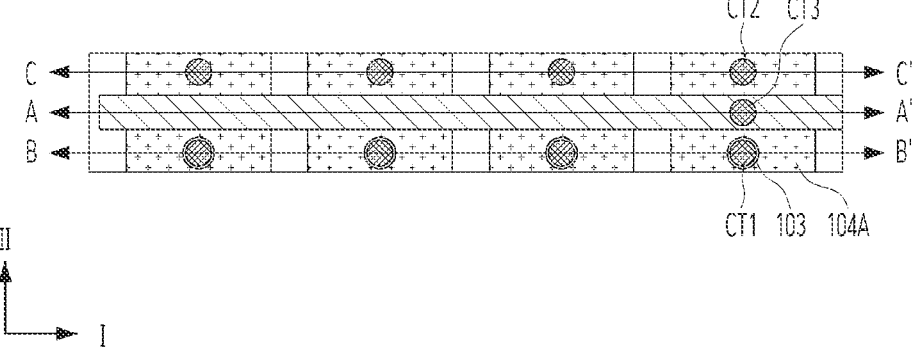

Referring to FIGS. 17A to 17C, the channel layer 104 may be etched to form channel patterns 104A. In an embodiment, the channel layer 104 may be etched using a mask pattern as an etch barrier. The channel patterns 104A may be respectively disposed correspondingly on first contact plugs CT1, and the channel patterns 104A and the first contact plugs CT1 may be respectively connected to each other. The channel pattern 104A and the local line 101L may be connected by the first contact plug CT1.

Subsequently, the channel patterns 104A may be oxidized to form gate insulating layers 105. Subsequently, a well region may be formed by doping a P-type of impurity in the channel patterns 104A.

Subsequently, a block word line 106 extending to cross the channel patterns 104A may be formed on the gate structure GST. In an embodiment, after forming a polysilicon layer 106A, a barrier layer 106B, and a metal layer 106C, a protective layer 109 may be formed on the metal layer 106C. Subsequently, the protective layer 109, the metal layer 106C, the barrier layer 106B, and the polysilicon layer 106A may be etched to form the block word line 106. The barrier layer 106B may be made of or include a metal nitride, and the metal layer 106C may be made of or include tungsten, molybdenum, or the like. The protective layer 109 may be for reducing oxidation of the metal layer 106C in a manufacturing process. In an embodiment, the protective layer 109 may include tetra ethyl ortho silicate (TEOS).

Referring to FIGS. 18A to 18D, a capping layer 107 may be formed. The capping layer 107 may surround a sidewall of the block word line 106. Here, the sidewall may be an etch surface ES, and the polysilicon layer 106A, the barrier layer 106B, and the metal layer 106C may be exposed through the etch surface ES. The capping layer 107 may reduce oxidation of the exposed polysilicon layer 106A and metal layer 106C. In an embodiment, the capping layer 107 may include nitride.

Subsequently, an interlayer insulating layer 108 may be formed, and second contact plugs CT2 extending through the interlayer insulating layer 108 may be formed. The second contact plug CT2 may pass through the capping layer 107 and the gate insulating layer 105, and may be connected to the channel pattern 104A. The channel pattern 104A and a global line may be connected by the second contact plug CT2.

A third contact plug CT3 extending through the interlayer insulating layer 108 may be formed. The third contact plug CT3 may pass through the capping layer 107 and the protective layer 109, and may be connected to the block word line 106. In an embodiment, the third contact plug CT3 may pass through the protective layer 109 to be connected to the metal layer 106C. The third contact plug CT3 may include a barrier metal layer and a gap-fill metal layer. For reference, when forming the third contact plug CT3, a contact plug connected to a channel structure may be formed.

According to the manufacturing method described above, pass transistors disposed in a region where the channel patterns 104A and the block word line 106 cross may be formed. The pass transistors may be disposed over the gate structure GST and may be disposed at substantially the same level.

FIGS. 19A to 19D are diagrams illustrating a manufacturing method according to an embodiment of the present invention disclosure. Hereinafter, a description of a content overlapping the content described above may be omitted.

Figure 19A:
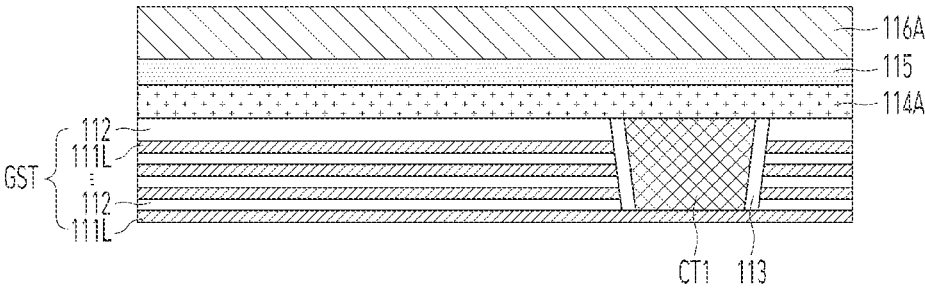
FIGS. 19A to 19D are diagrams illustrating a manufacturing method according to an embodiment of the present invention disclosure.

Referring to FIG. 19A, a gate structure GST including local lines 111L and insulating layers 112 alternately stacked may be formed. Subsequently, first contact plugs CT1 extending through the gate structure GST and respectively connected to the local lines 111L may be formed. Insulating spacers 113 may respectively surround sidewalls of the first contact plugs CT1. For reference, in the present figure, for convenience of description, one first contact plug CT1 is enlarged.

Subsequently, a channel layer 114 may be formed on the gate structure GST, and a gate insulating layer 115 may be formed on the channel layer 114. Subsequently, a conductive layer for forming a block word line may be formed on the gate insulating layer 115. In an embodiment, a polysilicon layer 116A may be formed on the gate insulating layer 115. The polysilicon layer 116A may be doped with an N-type or P-type of impurity.

Figure 19B:
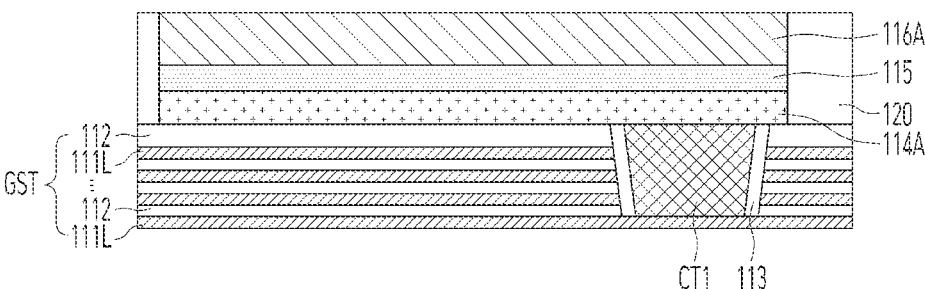

Referring to FIG. 19B, the polysilicon layer 116A, the gate insulating layer 115, and the channel layer 114 may be etched. Through this, a channel pattern 114A may be formed. Subsequently, an insulating layer 120 may be formed in a region where the polysilicon layer 116A, the gate insulating layer 115, and the channel layer 114 are etched.

Figure 19C:
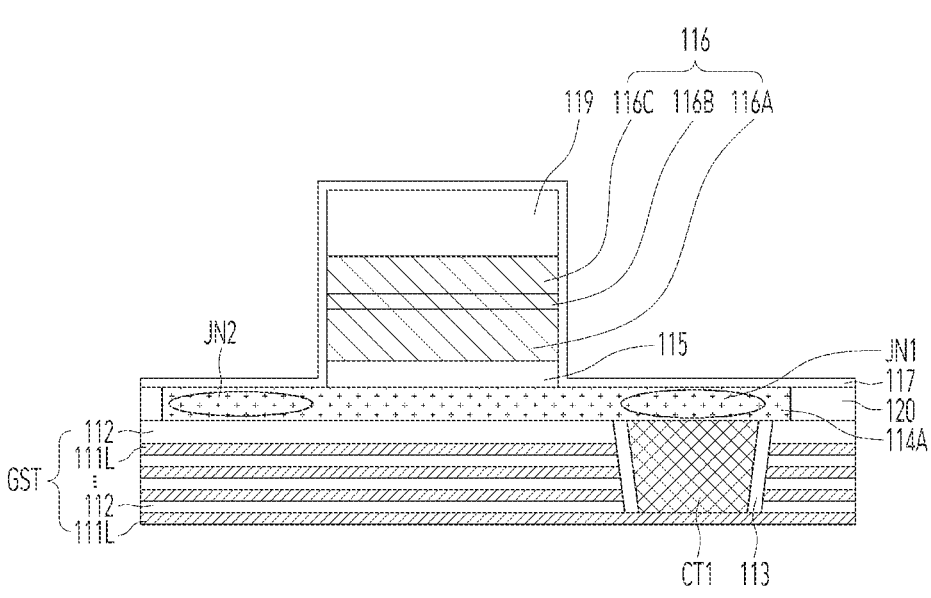
Figure 19D:
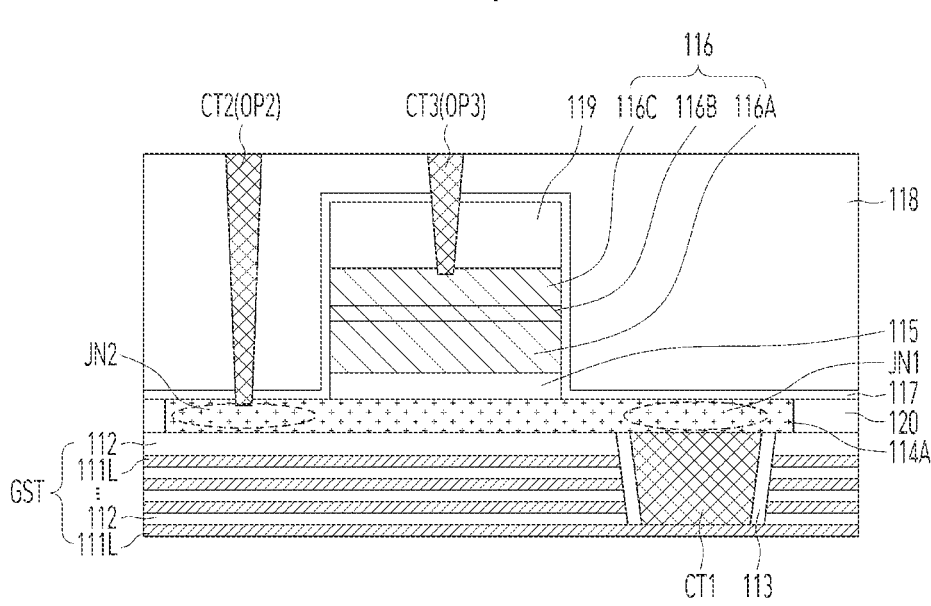

Referring to FIG. 19C, a barrier layer 116B, a metal layer 116C, and a protective layer 119 may be formed. Subsequently, after etching the protective layer 119, the metal layer 116C, the barrier layer 116B, and the polysilicon layer 116A may be etched to form the block word line 116. For reference, forming the block word line 116 may be possible by sequentially forming the polysilicon layer 116A, the barrier layer 116B, the metal layer 116C, and the protective layer 119, and then etching the polysilicon layer 116A, the barrier layer 116B, the metal layer 116C, and the protective layer 119 at once.

Subsequently, a capping layer 117 may be formed on the block word line 116 and the channel pattern 114A. Subsequently, the channel pattern 114A may be doped with an N type or P-type of impurity to form junctions JN1 and JN2. A first junction JN1 and a second junction JN2 may be formed on both sides of the block word line 116, and the first junction JN1 may be connected to the first contact plug CT1.

Subsequently, an interlayer insulating layer 118 may be formed, and second contact plugs CT2 extending through the interlayer insulating layer 118 may be formed. The second contact plug CT2 may pass through the capping layer 117 and may be connected to the channel pattern 114A. The second junction JN2 of the channel pattern 114A and a global line may be connected by the second contact plug CT2.

A third contact plug CT3 extending through the interlayer insulating layer 118 may be formed. The third contact plug CT3 may pass through the capping layer 117 and the protective layer 119, and may be connected to the block word line 116. In an embodiment, the third contact plug CT3 may be connected to the metal layer 116C.

When forming the second contact plug CT2, the third contact plug CT3 may be formed. When forming a second opening OP2 exposing the second junction JN2, a third opening OP3 exposing the block word line 116 may be formed. The third opening OP3 may expose the metal layer 116C. When forming the second contact plug CT2 in the second opening OP2, the third contact plug CT3 may be formed in the third opening OP3.

According to the manufacturing method described above, pass transistors disposed in a region where the channel patterns 114A and the block word line 116 cross may be formed. The pass transistors may be disposed over the gate structure GST, and may be disposed at substantially the same level.

Figure 20:
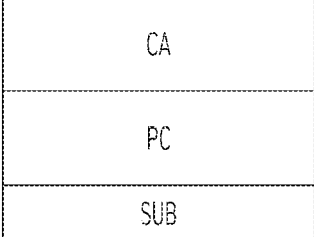
FIG. 20 is a configuration diagram of a semiconductor device according to an embodiment of the present invention disclosure.

The structure and the manufacturing method according to the above-described embodiments may be applied to semiconductor devices of various structures. FIGS. 20 and 21 illustrate a schematic configuration of a semiconductor device to which the above-described embodiments are applicable.

FIG. 20 is a configuration diagram of a semiconductor device according to an embodiment of the present invention disclosure.

Referring to FIG. 20, the semiconductor device may include a substrate SUB, a peripheral circuit PC, and a memory cell array CA. Here, the peripheral circuit PC and the memory cell array CA may be formed on the same substrate.

The substrate SUB may be made of or include a semiconductor material. In an embodiment, the semiconductor material may include at least one of a group IV semiconductor, a group III-V compound semiconductor, and a group II-VI compound semiconductor. Here, the group IV semiconductor may include single crystal silicon Si, polycrystalline silicon, germanium Ge, or silicon germanium SiGe. The group III-V compound semiconductor may include GaAs, GaN, GaP, GaAsP, GaInAsP, AlAs, AlGa, InP, InSb, or InGaAs. The group II-VI compound semiconductor may include ZnS, ZnO, or CdS.

The substrate SUB may include a dielectric layer. The substrate SUB may be a silicon-on-insulator (SOI) substrate, a germanium-on-insulator (GeOI) substrate, or a glass substrate. The substrate SUB may include an organic material. In an embodiment, the substrate SUB may include graphene.

The substrate SUB may be a bulk wafer or an epitaxial layer grown in a selective epitaxial growth (SEG) method. The substrate SUB may be a layer formed in a metal induced lateral crystallization (MILC) method and may partially include metal. The substrate SUB may have a single crystalline, polycrystalline, or amorphous state. The substrate SUB may include an impurity of group II, group III, group IV, group V, or group VI. In an embodiment, the substrate SUB may include an n-well region doped with an n-type impurity and/or a p-well region doped with a p-type impurity.

The peripheral circuit PC may be disposed between the substrate SUB and the memory cell array CA. The peripheral circuit PC may include a row decoder, a column decoder, a page buffer, a logic circuit, a control circuit, a sense amplifier, an input/output circuit, and the like. In an embodiment, the peripheral circuit PC may include an NMOS transistor, a PMOS transistor, a resistor, a capacitor, and the like. The peripheral circuit PC may further include an interconnection structure. The interconnection structure may be used as a path for transferring an operation voltage, and may include a contact plug, a line, and the like.

The memory cell array CA may include memory cells. In an embodiment, the memory cell array CA may include memory strings connected between a source line and a bit line, and each memory string may include stacked memory cells. In an embodiment, the memory cell array CA may include memory cells connected between a word line and a bit line. The memory cell array CA may further include an interconnection structure.

FIG. 21 is a configuration diagram of a semiconductor device according to an embodiment of the present invention disclosure.

Referring to FIG. 21, the semiconductor device may include a substrate SUB, a peripheral circuit PC, a bonding structure BS, and a memory cell array CA. Here, the peripheral circuit PC and the memory cell array CA may be respectively formed on separate substrates and then bonded. The semiconductor device may further include a support base SP_B.

The substrate SUB may be used as a support in a process of forming the peripheral circuit PC. The support base SP_B may be used as a support in a process of forming the memory cell array CA. In an embodiment, after respectively manufacturing a first wafer including the memory cell array CA and a second wafer including the peripheral circuit PC, the first wafer and the second wafer may be electrically connected by the bonding structure BS. After bonding, at least a portion of the support base SP_B of the first wafer may be removed. The support base SP_B may be completely removed or may partially remain on the memory cell CA array.

The support base SP_B may be a semiconductor substrate, an insulating substrate, a silicon-on-insulator (SOI) substrate, a germanium-on-insulator (GeOI) substrate, or the like. The support base SP_B may be a bulk wafer, an epitaxial layer grown in a selective epitaxial growth (SEG) method, or a layer formed in a metal induced lateral crystallization (MILC) method. The support base SP_B may have a single crystalline, polycrystalline, or amorphous state. The support base SP_B may include an impurity of group II, group III, group IV, group V, or group VI.

The bonding structure BS may be for connecting the memory cell array CA and the peripheral circuit PC. In an embodiment, the memory cell array CA and the peripheral circuit PC may be bonded in a wafer-on-wafer bonding method, a chip-on-wafer bonding method, a chip-on-chip bonding method, or the like. The bonding structure BS may include a bonding pad, a bonding layer, a bonding interface, and the like. The bonding pad may include a metal such as copper and aluminum, and/or an alloy. The bonding interface may include a non-metal-non-metal interface, a metal-metal interface, or the like. The memory cell array CA and the peripheral circuit PC may be electrically connected by the bonding structure BS.

For reference, an interconnection structure included in the memory cell array CA and/or the peripheral circuit PC may be directly connected without a bonding pad. In an embodiment, a bonding layer included in the memory cell array CA and a bonding layer included in the peripheral circuit PC may be bonded to form a bonding interface, and the interconnection structure included in the memory cell array CA and the interconnection structure included in the peripheral circuit PC may be directly connected. Through this, contact plugs, lines, and the like formed on different wafers may be electrically connected without a separate bonding pad.

Other configurations may be equal or similar to those described above with reference to FIG. 20.

Meanwhile, the semiconductor device may have a structure in which the embodiments described above with reference to FIGS. 20 and 21 are combined or may have a partially modified structure. In the embodiment described with reference to FIGS. 20 and 21, positions of the memory cell array CA and the peripheral circuit PC may be changed. At least one memory cell array CA and/or at least one peripheral circuit PC may be additionally bonded to the embodiment described with reference to FIG. 20. In an embodiment, a portion of the peripheral circuitry PC may be disposed in the memory cell array CA.

Although embodiments according to the technical concepts of the present invention disclosure have been described with reference to the accompanying drawings, this is only for describing an embodiment according to the concept of the present invention disclosure, and the present invention disclosure is not limited to the above-described embodiments. Within the scope of the technical concepts of the present invention disclosure described in the claims, various forms of substitution, modification, and change of the embodiments will be possible by those skilled in the art to which the present invention disclosure belongs, and these also belong to the scope of the present invention disclosure.

What is claimed is:

1. A semiconductor device comprising:
a gate structure including stacked local lines and a multi-step structure, wherein the multi-step structure defines pads of the local lines;
channel patterns respectively disposed over the pads;
a block word line disposed over the channel patterns and extending along a profile of the multi-step structure; and
first contact plugs passing through the channel patterns and respectively connecting the channel patterns and the local lines.

2. The semiconductor device of claim 1, further comprising:
global lines disposed over the gate structure; and
second contact plugs respectively connecting the channel patterns and the global lines.

3. The semiconductor device of claim 1, wherein the multi-step structure extends in a first direction, and the channel patterns are arranged in the first direction.

4. The semiconductor device of claim 1, wherein the block word line extends in a first direction, and the channel patterns extend in a second direction crossing the first direction.

5. The semiconductor device of claim 1, further comprising:
a gate insulating layer disposed between the channel patterns and the block word line.

6. The semiconductor device of claim 1, further comprising:
an etch stop layer disposed over the block word line.

7. The semiconductor device of claim 6, wherein the first contact plugs pass through the etch stop layer.

8. The semiconductor device of claim 1, wherein the block word line includes a plurality of protrusions spaced apart from each other and protruding between the channel patterns.

9. The semiconductor device of claim 8, wherein the block word line surrounds top surfaces and sidewalls of the channel patterns.

10. A semiconductor device comprising:
a gate structure including stacked local lines;
first contact plugs extending through the gate structure and respectively connected to the local lines;
channel patterns disposed over the gate structure and respectively connected to the first contact plugs; and
a block word lines disposed over the channel patterns.

11. The semiconductor device of claim 10, further comprising:
global lines disposed over the gate structure; and
second contact plugs respectively connecting the channel patterns and the global lines.

12. The semiconductor device of claim 11, wherein the first contact plugs are connected to lower surfaces of the channel patterns, and the second contact plugs are connected to top surfaces of the channel patterns.

13. The semiconductor device of claim 10, further comprising:
gate insulating layers respectively surrounding the channel patterns.

14. The semiconductor device of claim 10, further comprising:
a capping layer disposed over the block word line and surrounding a sidewall of the block word line.

15. The semiconductor device of claim 14, further comprising:
global lines disposed over the gate structure; and
second contact plugs passing through the capping layer and respectively connecting the channel patterns and the global lines.

16. The semiconductor device of claim 10, wherein the block word line includes protrusions protruding between the channel patterns.

17. The semiconductor device of claim 16, wherein the block word line surrounds top surfaces and sidewalls of the channel patterns.

18. The semiconductor device of claim 10, further comprising:
a third contact plug connected to the block word line.

* * * * *